United States Patent
Weber et al.

(10) Patent No.: US 6,332,183 B1
(45) Date of Patent: *Dec. 18, 2001

(54) METHOD FOR RECOVERY OF USEFUL AREAS OF PARTIALLY DEFECTIVE SYNCHRONOUS MEMORY COMPONENTS

(75) Inventors: Richard Weber, Boise; Corey Larsen, Marsing, both of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/035,739

(22) Filed: Mar. 5, 1998

(51) Int. Cl.[7] ............................. G06F 12/02; G06F 11/00
(52) U.S. Cl. ............................................. 711/170; 711/154
(58) Field of Search ................................... 711/104, 105, 711/154, 165, 170, 173; 365/52, 200, 230.03; 714/6, 7, 710, 711

(56) References Cited

U.S. PATENT DOCUMENTS

| | | | |
|---|---|---|---|
| 3,714,637 | 1/1973 | Beausoleil | 365/200 |
| 3,715,735 | 2/1973 | Moss | 365/94 |
| 3,735,368 | 5/1973 | Beausoleil | 365/200 |
| 3,772,652 | 11/1973 | Hilberg | 711/115 |
| 3,781,826 | 12/1973 | Beausoleil | 365/200 |
| 3,800,294 | 3/1974 | Lawlor | 340/172.5 |
| 3,845,476 * | 10/1974 | Boehm | 365/200 |
| 4,355,376 * | 10/1982 | Gould | 365/200 |
| 4,376,300 | 3/1983 | Tsang | 365/200 |
| 4,450,560 | 5/1984 | Conner | 371/25 |
| 4,475,194 | 10/1984 | LaVallee et al. | 714/710 |
| 4,479,214 | 10/1984 | Ryan | 371/11 |
| 4,493,075 | 1/1985 | Anderson et al. | 714/711 |
| 4,527,251 | 7/1985 | Nibby, Jr. et al. | 714/8 |
| 4,646,299 | 2/1987 | Schinabeck et al. | 371/20 |
| 4,807,191 | 2/1989 | Flannagan | 365/189 |
| 4,837,747 | 6/1989 | Dosaka et al. | 714/711 |
| 4,876,685 | 10/1989 | Rich | 371/21.6 |
| 4,881,200 | 11/1989 | Urai | 365/189.04 |
| 4,908,798 | 3/1990 | Urai | 365/230.03 |
| 4,918,662 | 4/1990 | Kondo | 365/210 |
| 4,935,899 | 6/1990 | Morigami | 365/200 |
| 4,992,984 * | 2/1991 | Busch et al. | 365/200 |
| 5,051,994 | 9/1991 | Bluethman et al. | 714/8 |
| 5,060,197 | 10/1991 | Park et al. | 365/200 |
| 5,124,948 | 6/1992 | Takizawa et al. | 365/200 |
| 5,126,973 | 6/1992 | Gallia et al. | 365/200 |
| 5,134,584 | 7/1992 | Boler et al. | 365/200 |
| 5,200,959 | 4/1993 | Gross et al. | 371/21.6 |
| 5,208,775 | 5/1993 | Lee | 365/200 |
| 5,233,614 | 8/1993 | Singh | 371/21.6 |
| 5,243,570 | 9/1993 | Saruwatari | 365/201 |
| 5,251,174 | 10/1993 | Hwang | 365/200 |
| 5,268,866 | 12/1993 | Feng et al. | 365/200 |
| 5,270,974 | 12/1993 | Reddy | 365/200 |
| 5,270,976 | 12/1993 | Tran | 365/200 |

(List continued on next page.)

OTHER PUBLICATIONS

"MindShare, Inc., Anderson and Shanley," Pentium™ Processor System Architecture, Second Edition, PC System Architecture Series: 126–132, 221–234, 1995.

Intel, PC SDRAM Unbuffered DIMM Specification, Revision 1.0, Feb. 1998, 47 pages.

Intel, PC SDRAM Specification, Revision 1.63, Oct. 1998.

*Primary Examiner*—Kevin L. Ellis
(74) *Attorney, Agent, or Firm*—Knobbe, Martens, Olson & Bear, LLP

(57) ABSTRACT

Memory module using partially defective synchronous memory devices, such as SDRAM components. Multiple partially defective SDRAM components are configured to provide a reliable and nondefective memory module that takes advantage of the manner in which defective cells are localized on each SDRAM component.

12 Claims, 32 Drawing Sheets

U.S. PATENT DOCUMENTS

| | | | |
|---|---|---|---|
| 5,315,552 | 5/1994 | Yoneda | 365/200 |
| 5,327,380 | 7/1994 | Kersh et al. | 365/195 |
| 5,331,188 | 7/1994 | Acovic et al. | 257/298 |
| 5,332,922 | 7/1994 | Oguchi et al. | 257/723 |
| 5,337,277 | 8/1994 | Jang | 365/200 |
| 5,349,556 | 9/1994 | Lee | 365/200 |
| 5,371,866 | 12/1994 | Cady | 395/400 |
| 5,379,415 | 1/1995 | Papenberg et al. | 395/575 |
| 5,390,129 | 2/1995 | Rhodes | 364/480 |
| 5,392,247 | 2/1995 | Fujita | 365/200 |
| 5,400,263 | 3/1995 | Rohrbaugh et al. | 364/490 |
| 5,400,342 | 3/1995 | Matsumura et al. | 371/21.2 |
| 5,406,565 | 4/1995 | MacDonald | 714/711 |
| 5,410,545 | 4/1995 | Porter et al. | 371/21.6 |
| 5,424,989 | 6/1995 | Hagiwara et al. | 365/201 |
| 5,434,792 | 7/1995 | Saka et al. | 364/468 |
| 5,465,234 | 11/1995 | Hannai | 365/200 |
| 5,469,390 | 11/1995 | Sasaki et al. | 365/200 |
| 5,475,648 | 12/1995 | Fujiwara | 365/230.06 |
| 5,475,695 | 12/1995 | Caywood et al. | 371/27 |
| 5,491,664 | 2/1996 | Phelan | 365/200 |
| 5,497,381 | 3/1996 | O'Donoghue et al. | 371/28 |
| 5,502,333 | 3/1996 | Bertin et al. | 257/685 |
| 5,513,135 | 4/1996 | Dell et al. | 365/52 |
| 5,528,553 | 6/1996 | Saxena | 365/230.01 |
| 5,535,328 | 7/1996 | Harari et al. | 395/182.05 |
| 5,538,115 | 7/1996 | Koch | 188/299 |
| 5,539,697 | 7/1996 | Kim et al. | 365/200 |
| 5,544,106 | 8/1996 | Koike | 365/200 |
| 5,548,553 | 8/1996 | Cooper et al. | 365/200 |
| 5,553,231 | 9/1996 | Papenberg et al. | 395/182.03 |
| 5,576,999 | 11/1996 | Kim et al. | 365/200 |
| 5,588,115 | 12/1996 | Augarten | 395/183.05 |
| 5,600,258 | 2/1997 | Graham et al. | 324/758 |
| 5,602,987 | 2/1997 | Harari et al. | 395/182.06 |
| 5,631,868 | 5/1997 | Termullo et al. | 365/200 |
| 5,633,826 | 5/1997 | Tsukada | 365/200 |
| 5,636,173 * | 6/1997 | Schaefer | 365/230.03 |
| 5,654,204 | 8/1997 | Anderson | 438/15 |
| 5,668,763 | 9/1997 | Fujioka et al. | 365/200 |
| 5,717,694 | 2/1998 | Ohsawa | 371/5.1 |
| 5,734,621 | 3/1998 | Ito | 365/230.03 |
| 5,745,673 | 4/1998 | Di Zenzo et al. | 395/182.05 |
| 5,754,753 | 5/1998 | Smelser | 395/182.06 |
| 5,758,056 | 5/1998 | Barr | 395/182.05 |
| 5,768,173 * | 6/1998 | Seo et al. | 365/52 |
| 5,798,962 | 8/1998 | Di Zeno et al. | 365/52 |
| 5,841,710 | 11/1998 | Larsen | 365/200 |
| 5,862,314 | 1/1999 | Jeddeloh | 395/182.06 |
| 5,896,346 * | 4/1999 | Dell et al. | 365/233 |
| 5,913,020 | 6/1999 | Rohwer | 395/182.06 |
| 5,920,512 | 7/1999 | Larsen | 365/200 |
| 5,920,513 * | 7/1999 | Jacobson | 365/200 |
| 5,956,233 | 9/1999 | Yew et al. | 361/760 |
| 5,963,463 | 10/1999 | Rondeau et al. | 365/52 |
| 5,966,724 | 10/1999 | Ryan | 711/105 |
| 5,970,008 * | 10/1999 | Zagar et al. | 365/226 |
| 5,974,564 | 10/1999 | Jeddeloh | 714/8 |
| 5,991,215 | 11/1999 | Brunelle | 365/201 |
| 5,995,409 | 11/1999 | Holland | 365/149 |
| 6,009,536 | 12/1999 | Rohwer | 714/8 |

* cited by examiner

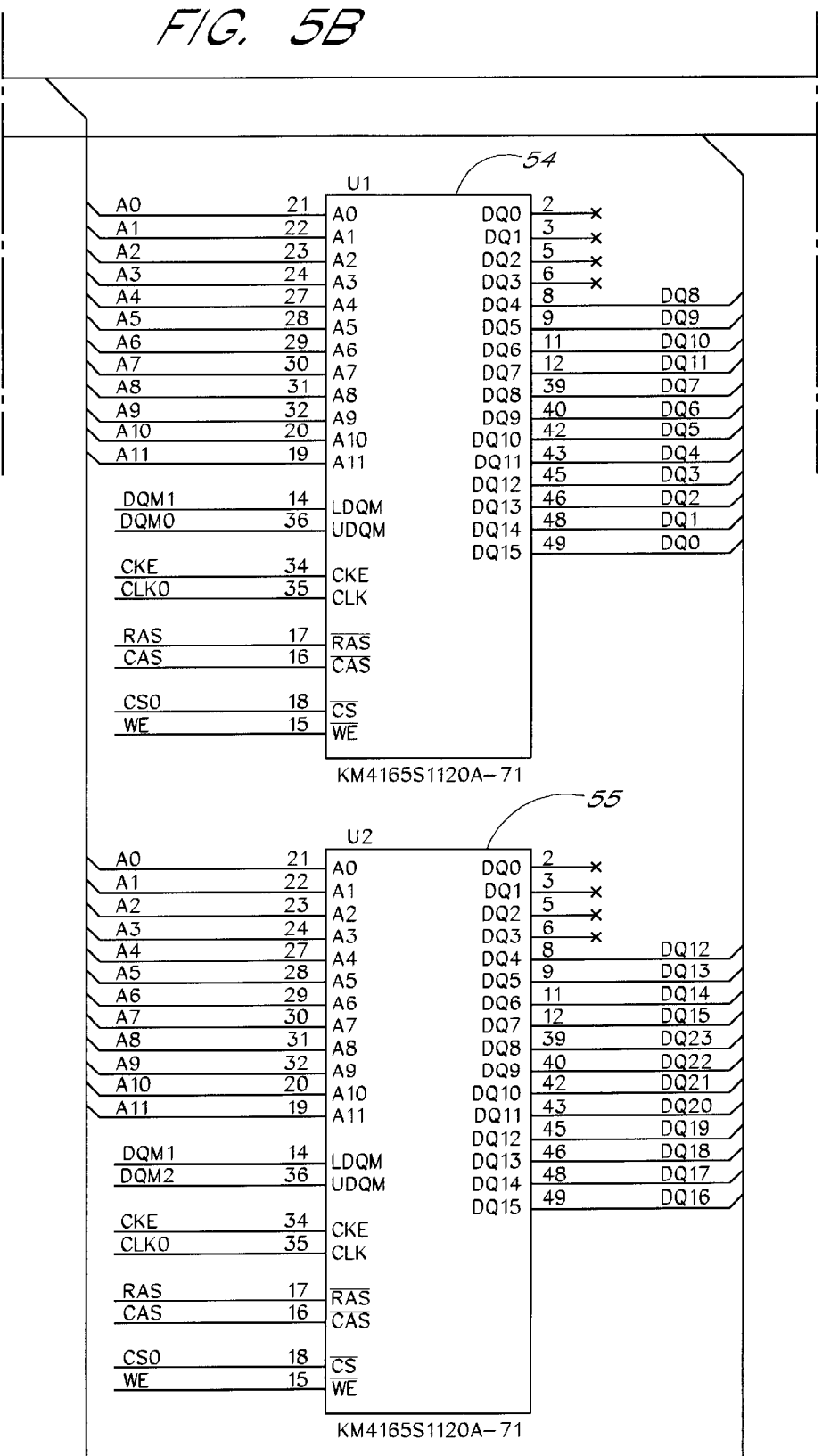

| FIG. 6A | FIG. 6B | FIG. 6C | FIG. 6D | FIG. 6E |
|---------|---------|---------|---------|---------|
| FIG. 6F | FIG. 6G | FIG. 6H | FIG. 6I | FIG. 6J |

FIG. 6

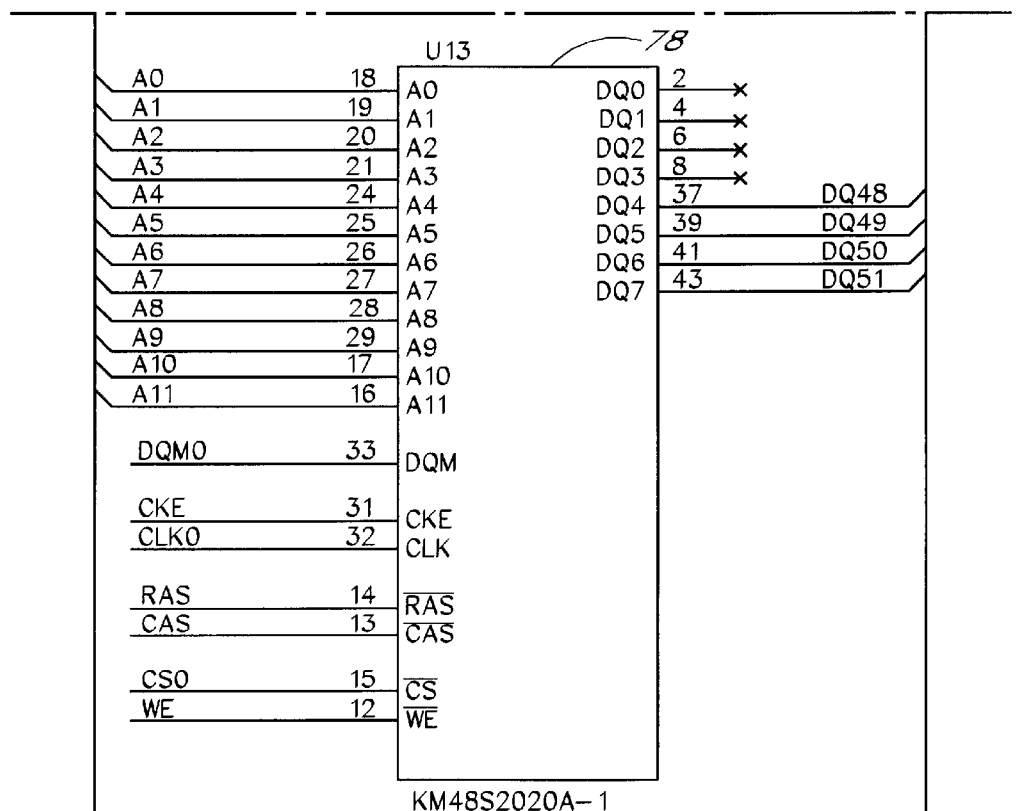
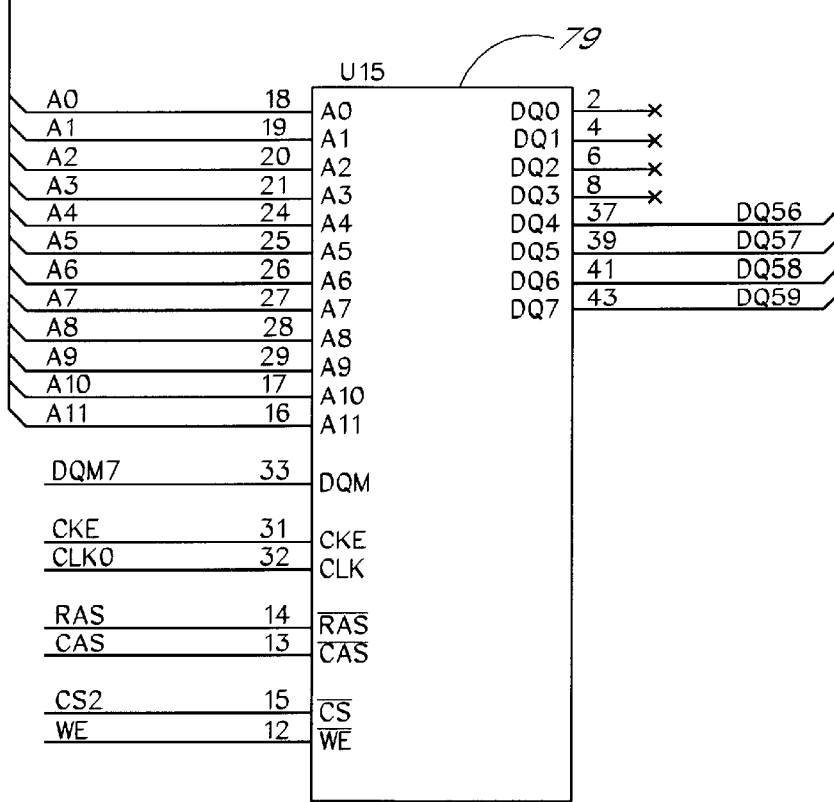
FIG. 6H

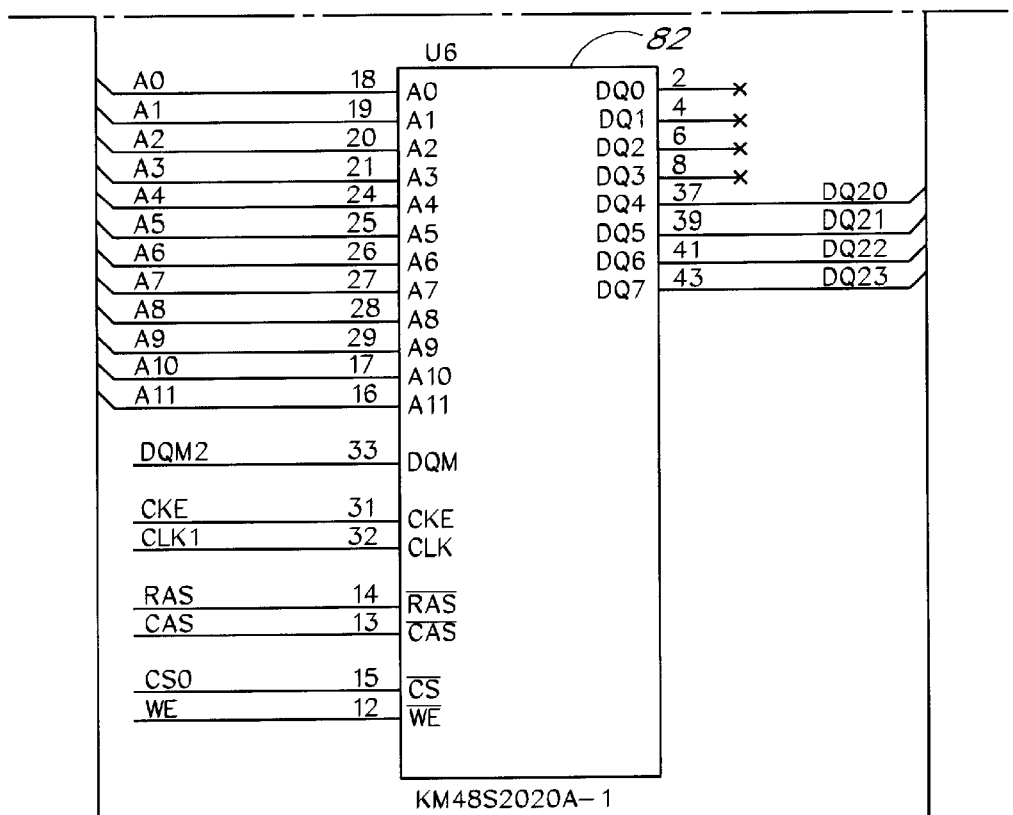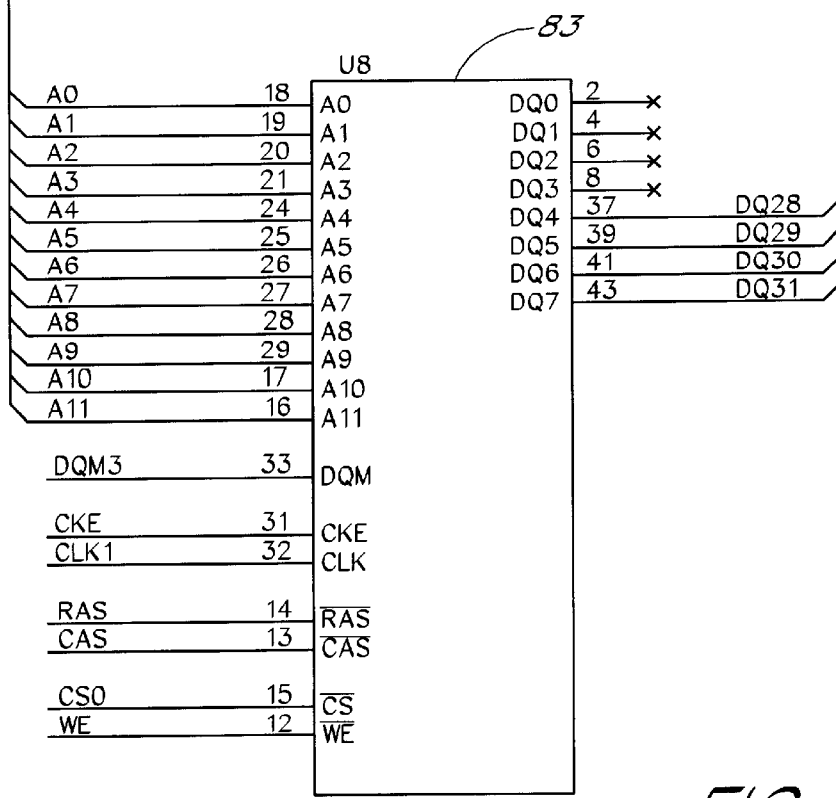
FIG. 61

| FIG. 7A | FIG. 7B | FIG. 7C | FIG. 7D | FIG. 7E |
|---|---|---|---|---|
| FIG. 7F | FIG. 7G | FIG. 7H | FIG. 7I | FIG. 7J |

*FIG. 7*

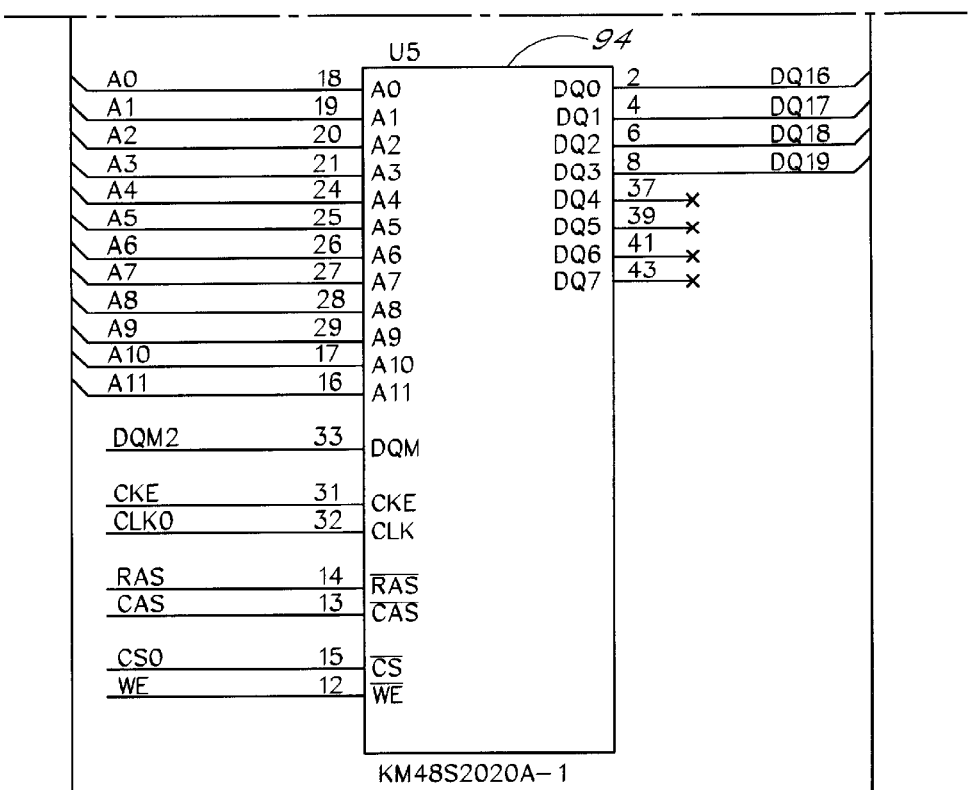
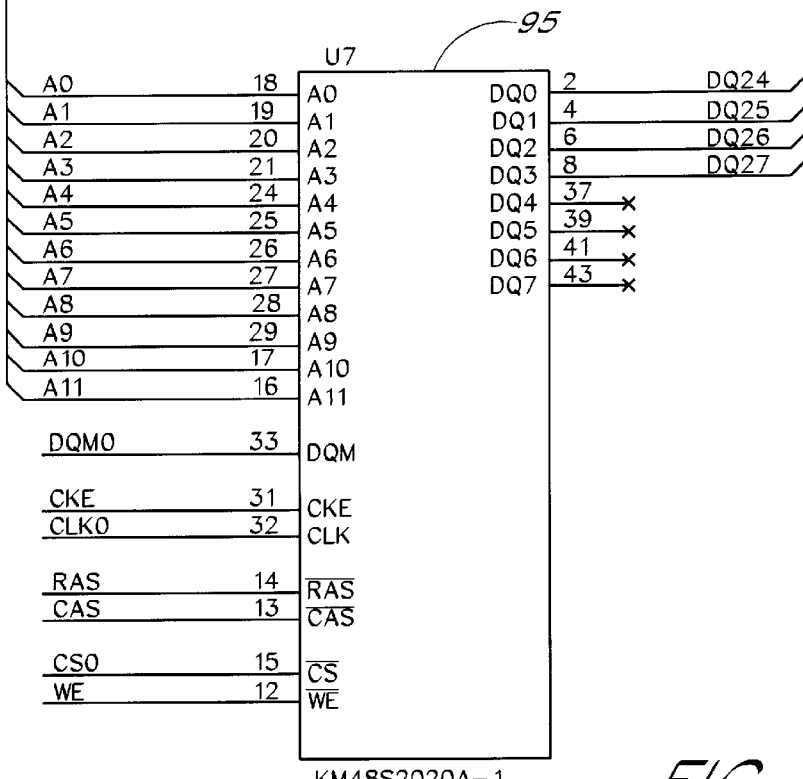
FIG. 7G

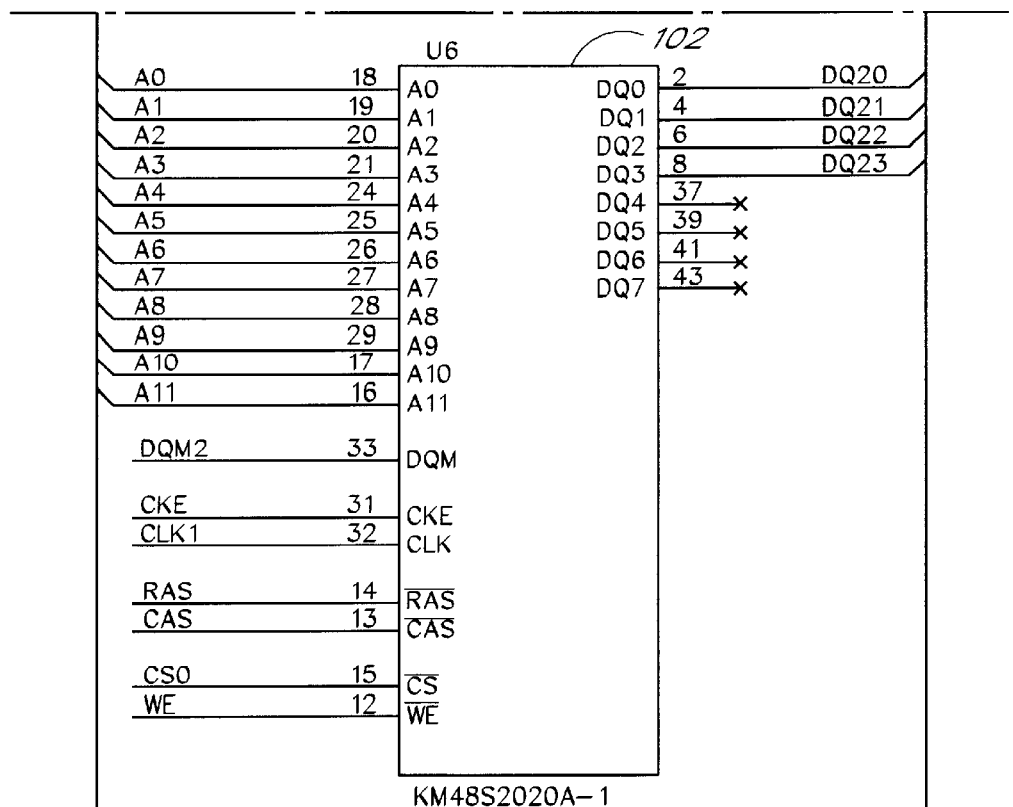
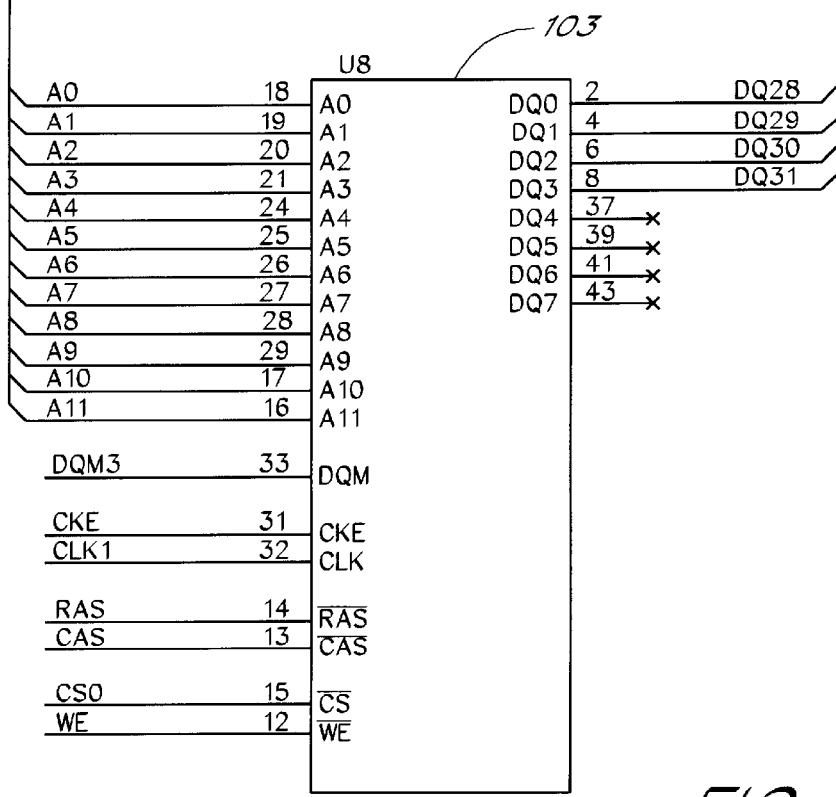
FIG. 71

METHOD FOR RECOVERY OF USEFUL AREAS OF PARTIALLY DEFECTIVE SYNCHRONOUS MEMORY COMPONENTS

This application includes subject matter related to application Ser. No. 09/035,629, filed concurrently herewith on Mar. 5, 1998.

FIELD OF THE INVENTION

The present invention relates generally to the use partially defective synchronous memory chips. More particularly, the present invention relates to the configuration of defective SDRAM components to create a nondefective memory module or array.

BACKGROUND AND SUMMARY OF THE DISCLOSURE

As is well known in the art, during the production of monolithic memory devices from silicon wafers, some of the memory storage cells can become defective and unreliable. The defective cells can be the result of a number of causes, such as impurities introduced in the process of manufacturing the monolithic memory device from the silicon wafer, or localized imperfections in the silicon substrate itself.

Often, while some memory cells are defective, many other cells on the same memory chip are not defective, and will work reliably and accurately. In addition, it is often the case that the defective cells are localized and confined to particular outputs from the memory device. The remaining, nondefective outputs can be relied upon to provide a consistent and accurate representation of the information in the storage cell.

Techniques have been developed for salvaging the nondefective portions of defective asynchronous memory technologies (e.g., DRAM). Asynchronous memory technologies are relatively slow devices that operate in response to control signals generated by a memory controller, rather than in response to the system clock. The control signals allow the asynchronous memory device to operate at a speed that is much slower than the system clock, and that ensures reliable read and write memory operations.

Synchronous memory devices such as SDRAM, on the other hand, are much faster devices that operate on the system clock. SDRAM is an improvement over prior memory technologies principally because SDRAM is capable of synchronizing itself with the microprocessor's clock. This synchronization can eliminate the time delays and wait states often necessary with prior memory technologies (e.g., DRAM), and it also allows for fast consecutive read and write capability.

However, no attempts have been made to salvage non-defective portions of synchronous memory. Some people skilled in the art may believe that the use of techniques for salvaging defective memory devices would not work with higher-speed synchronous memory devices such as SDRAM because they operate at much higher speeds than previous memory devices, such as asynchronous DRAM. For SDRAM, it may be believed that the rate at which the clock input cycles and the load on the device driving the inputs (e.g., the clock and the address) to the SDRAM devices would make reliable input transitions unattainable.

The present invention addresses the problem of salvaging partially defective synchronous memory devices. In one embodiment of the present invention, multiple partially defective SDRAM components are configured to provide a reliable and nondefective memory module. Such an embodiment takes advantage of the manner in which defective cells are localized on each memory chip, and combines multiple memory chips to provide a memory bus that is of the desired width and granularity. In addition, it is possible with such an embodiment to provide a computer system in which the main memory is synchronized with the system clock, and is constructed, at least in part, from partially defective memory chips.

The nature of the present invention as well as other embodiments of the present invention may be more clearly understood by reference to the following detailed description of the invention, to the appended claims, and to the several drawings herein.

BRIEF DESCRIPTION OF THE DRAWINGS

FIG. 4A is a memory map showing defective memory cells corresponding to a defect that differs from that of FIG. 4.

DETAILED DESCRIPTION

Figure 1:
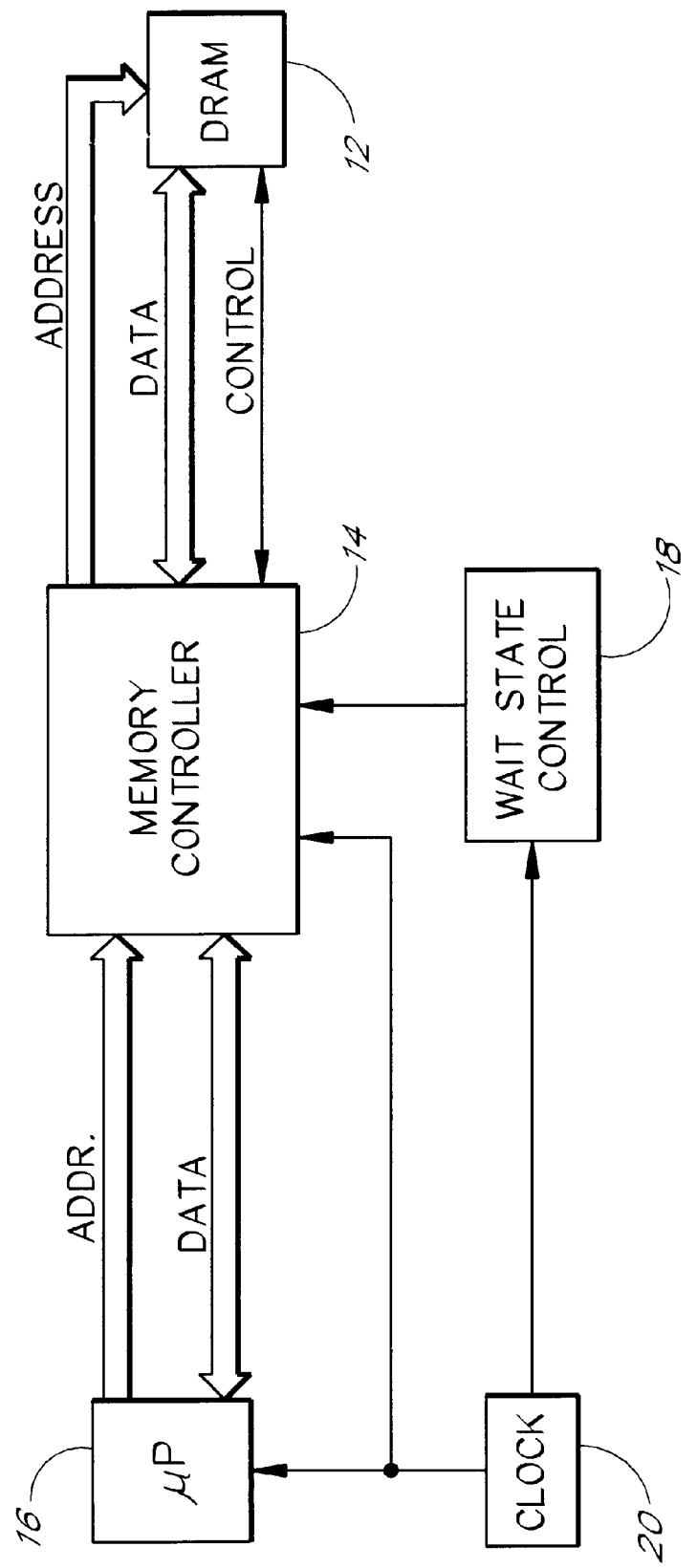
FIG. 1 is a block diagram of a prior art computer system using a wait state control device with DRAM memory chips.

FIG. 1 is a block diagram of a prior art computer system comprising a microprocessor 16, a memory controller 14, and main memory 12. In the system shown, main memory 12 is made up of dynamic random access memory (DRAM). Also shown in FIG. 1 is a wait state control device 18 and a system clock 20. As is well known in the art, due to differences in speed between the processor 16 and the DRAM 12, it is often necessary to insert "wait states" when the processor carries out a memory operation involving the DRAM 12. Typically, the DRAM 12 is slower than the processor 16, so one or more additional states are added to the microprocessor's memory access cycle to ensure that the memory 12 is given a sufficient amount of time to carry out the memory (read/write) operation.

In addition, the clock 20 in the system of FIG. 1 is not a direct input to the DRAM 12. Instead, as is well known in the art, control signals are derived from the clock, and the DRAM 12 is operated through the use of these control signals. The signals presented to the DRAM device 12 change relatively slowly compared to the rate at which the clock changes.

Figure 2:
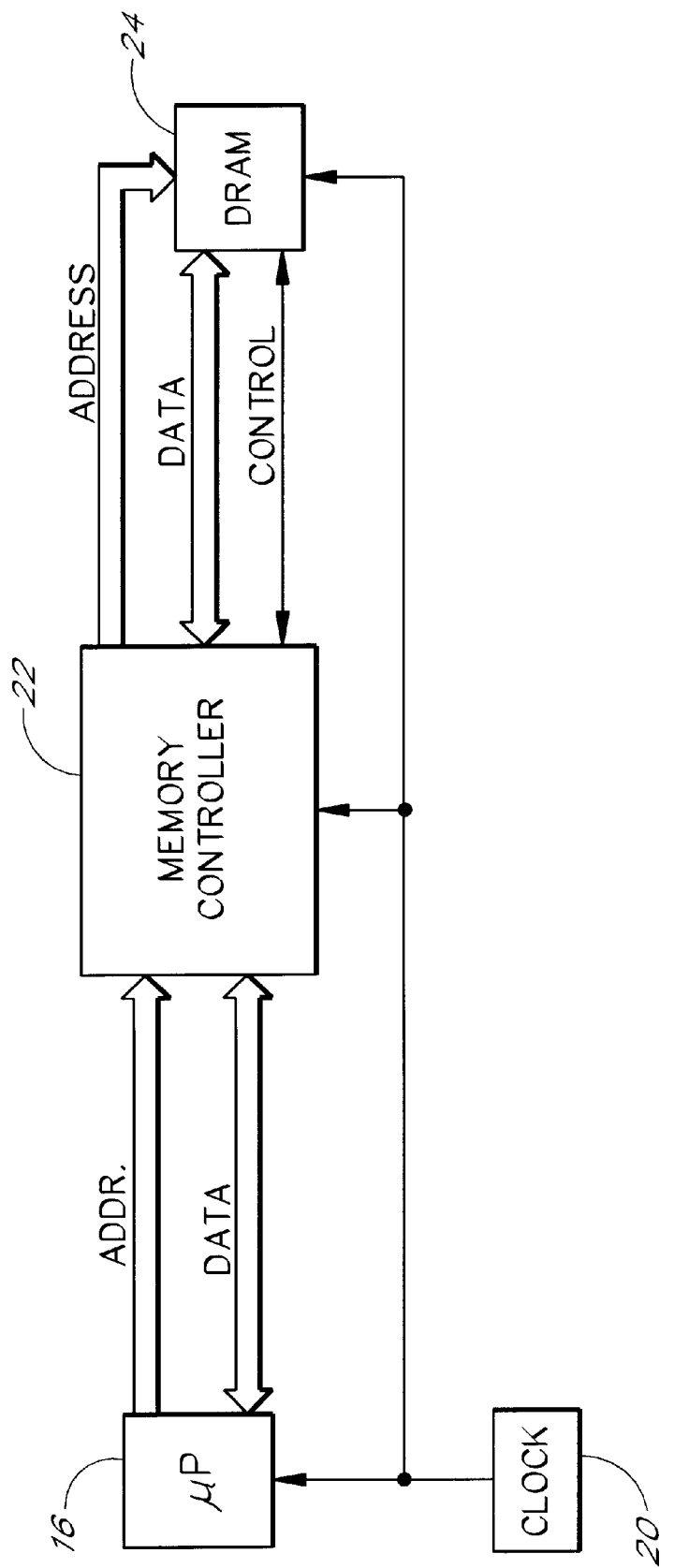
FIG. 2 is a block diagram of a computer system employing SDRAM memory chips.

FIG. 2 shows a block diagram of a computer system in one embodiment of the present invention, where the computer system comprises a clock 20, a processor 16, a memory controller 22, and main memory 24. Often, the clock 20 operates at 66 MHz or 100 MHz, but it may operate at any speed. Unlike FIG. 1, the main memory in FIG. 2 is made up of one or more SDRAM chips, and the SDRAM memory is synchronized with the clock 20, which means that it operates synchronously with the clock 20. This synchronization can eliminate some or all of the wait states normally necessary with DRAM devices, and it also allows for fast consecutive read and write capability. Unlike FIG. 1, in FIG. 2 the clock 20 is provided as an input to the memory 24. Thus, in FIG. 2, at least some of the inputs to the memory 24 may change at a rate approaching or equal to the rate of the clock 20.

Figure 3:
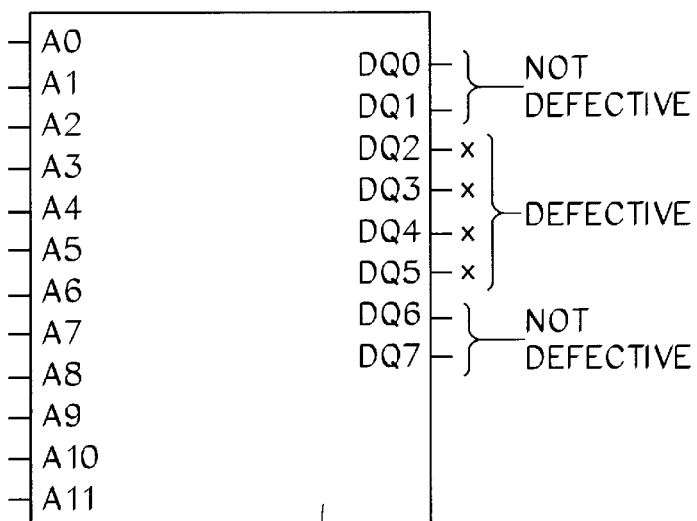
FIG. 3 is a block diagram of a partially defective SDRAM component.

FIG. 3 is a block diagram of a partially defective SDRAM component 26 having twelve address inputs A0 to A11, and eight data outputs DQ0 to DQ7. The component 26 is a 1024 K×8×2 SDRAM. The "8" in this description represents the eight output lines, meaning the data width is 8 bits wide (the granularity may also be eight bits). The "1024K" is the addressable space in each bank of memory within the SDRAM, and the "2" indicates that there are two such 1024K banks of memory within this component. Generally, components such as that described in FIG. 3 are mounted on SIMMs (Single In-line Memory Modules) or DIMMs (Dual Inline Memory Modules), but any other appropriate packaging technology could be used to practice one or more of the inventions described herein.

In operation, the SDRAM component 26 is addressed by using a multiplexed row and column address, as is well known in the art. The twelve address inputs on the memory component are first presented with an eleven bit row address on A0 to A10. After the row address has been presented to the SDRAM 26, an nine bit column address is presented to the SDRAM 26 on address inputs A0 to A8. Thus, the full address is twenty bits wide, thereby making a 1024K address space based on the row and column addresses. The SDRAM 26 has two of these 1024K banks of memory addressable with the row and column addresses. The particular 1024K bank within the SDRAM component is selected by an additional row address bit, which is presented to the SDRAM with the row address on address input A11.

The SDRAM component shown in FIG. 3 is partially defective in the sense that some of the DQ outputs do not consistently present valid or accurate data. In the particular SDRAM shown in FIG. 3, data outputs DQ2 to DQ5 are defective, whereas data outputs DQ0, DQ1, DQ6, and DQ7 are not defective. Thus, these latter DQ outputs can be relied upon for accurate and consistent data, whereas the data outputs DQ2 to DQ5 cannot.

Figure 4:
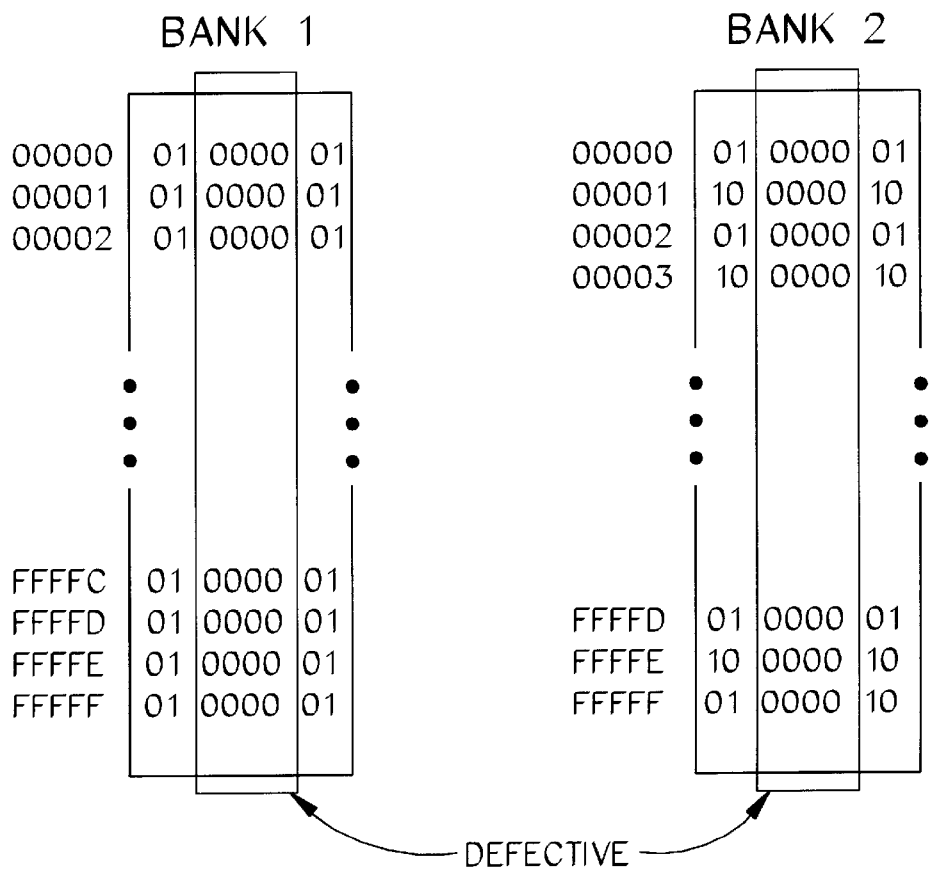
FIG. 4 is a memory map showing the localized nature of defective memory cells in one embodiment of the present invention.

FIG. 4 is a memory map of the SDRAM component of FIG. 3, showing the portions of memory that are defective. As can be seen from FIG. 4, in the particular SDRAM component of FIG. 3, the defects are such that every addressable eight bit memory location has both reliable and unreliable (or unused) DQ outputs, and they are consistently arranged within each addressable octet.

This result may follow from the nature of the defect, where certain DQ outputs always present valid data, whereas other DQ outputs may not be reliable, and may occasionally present bad data. Defects in the silicon or impurities introduced in the manufacturing process will often result in defects like those illustrated in FIG. 4.

Figure 5:
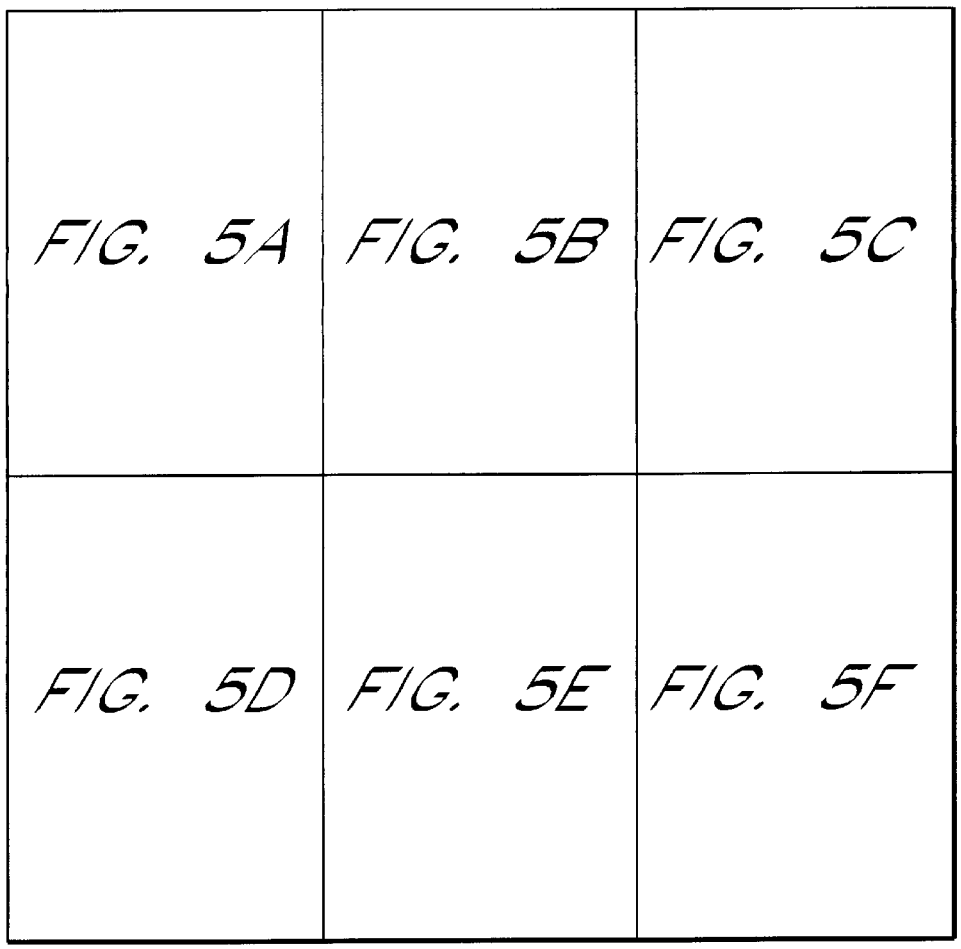
FIG. 5 is an embodiment of the present invention using six partially defective SDRAM components to make a 64-bit memory module.
Figure 5A:
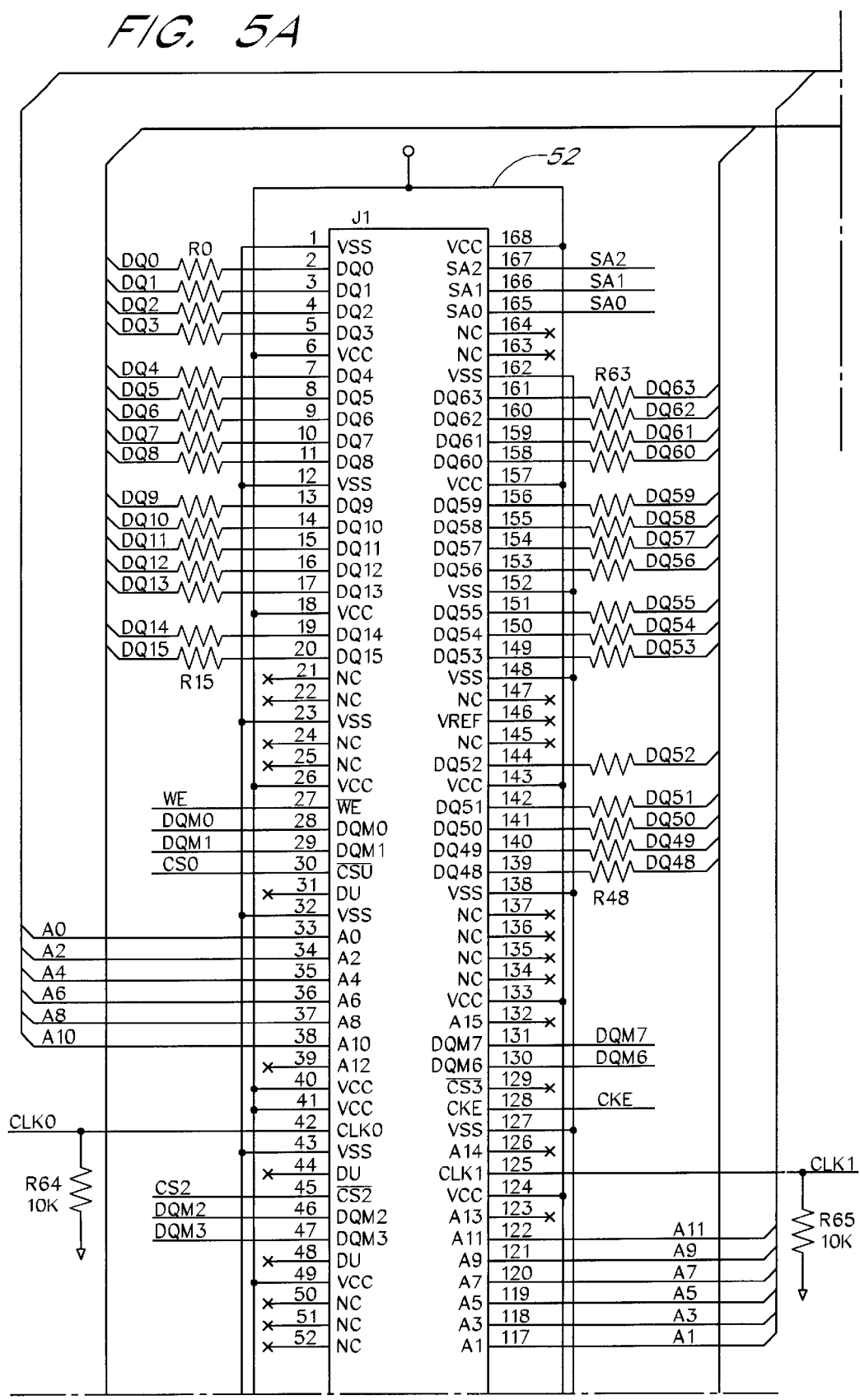
Figure 5C:
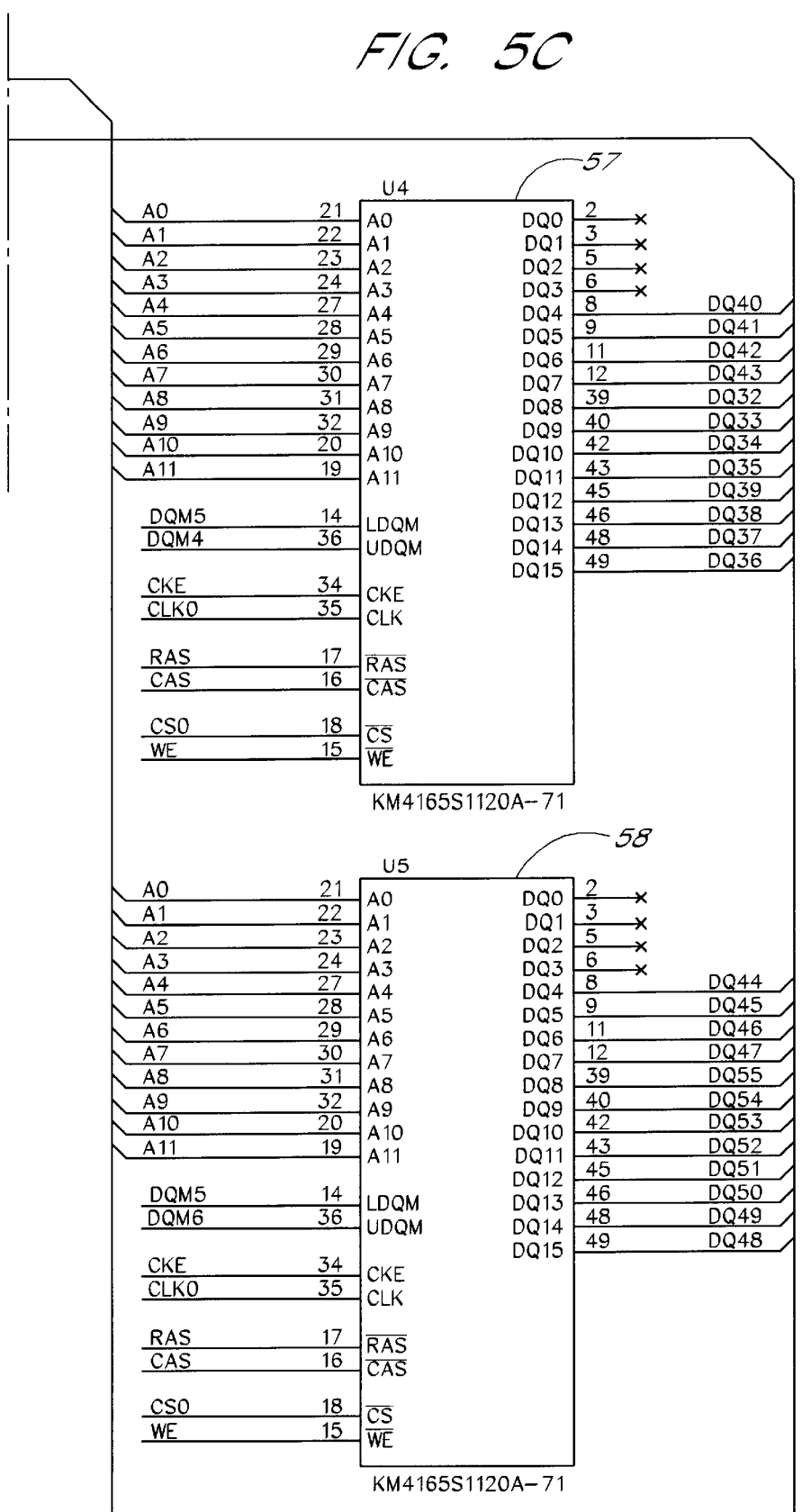
Figure 5D:
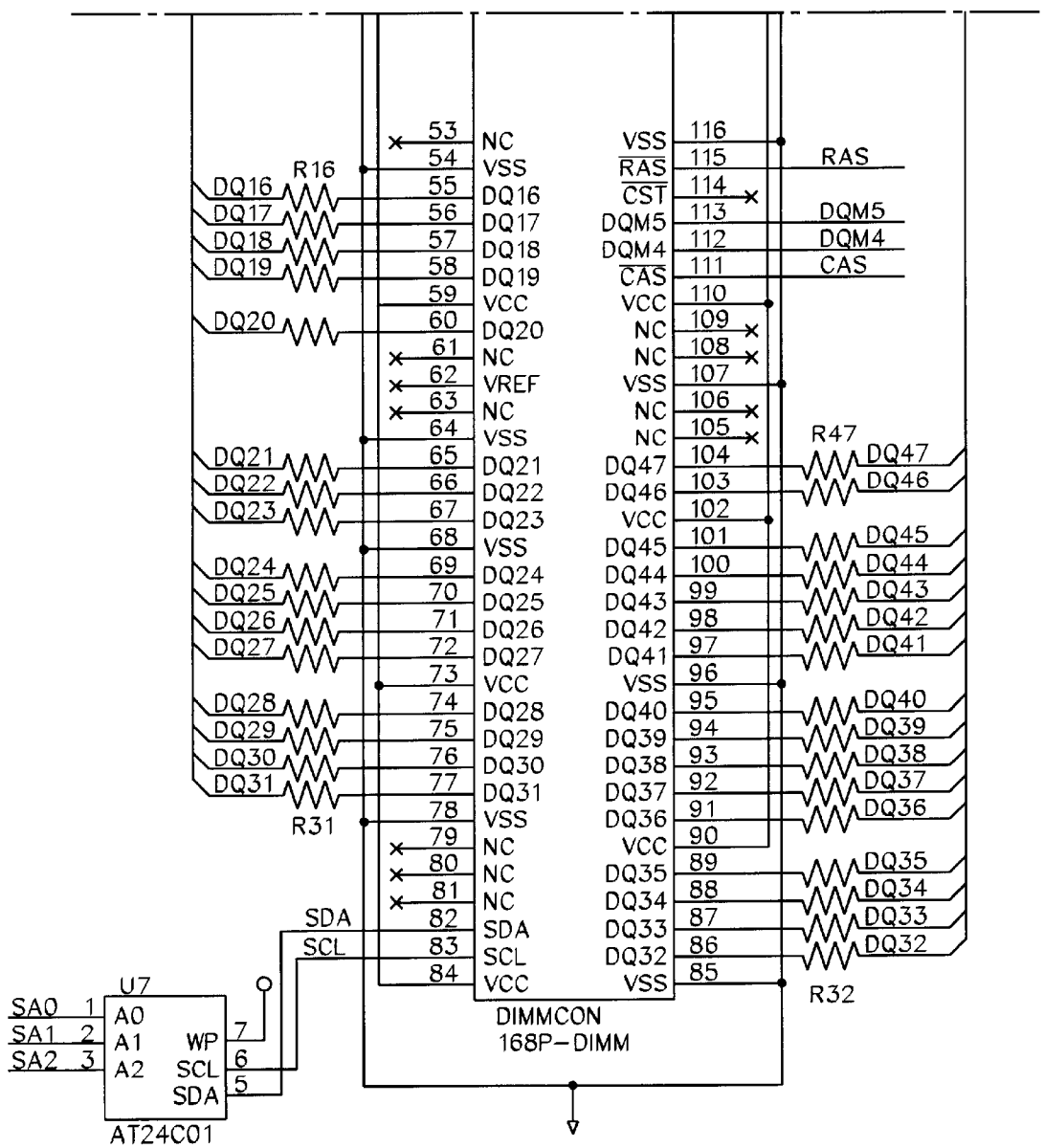
Figure 5E:
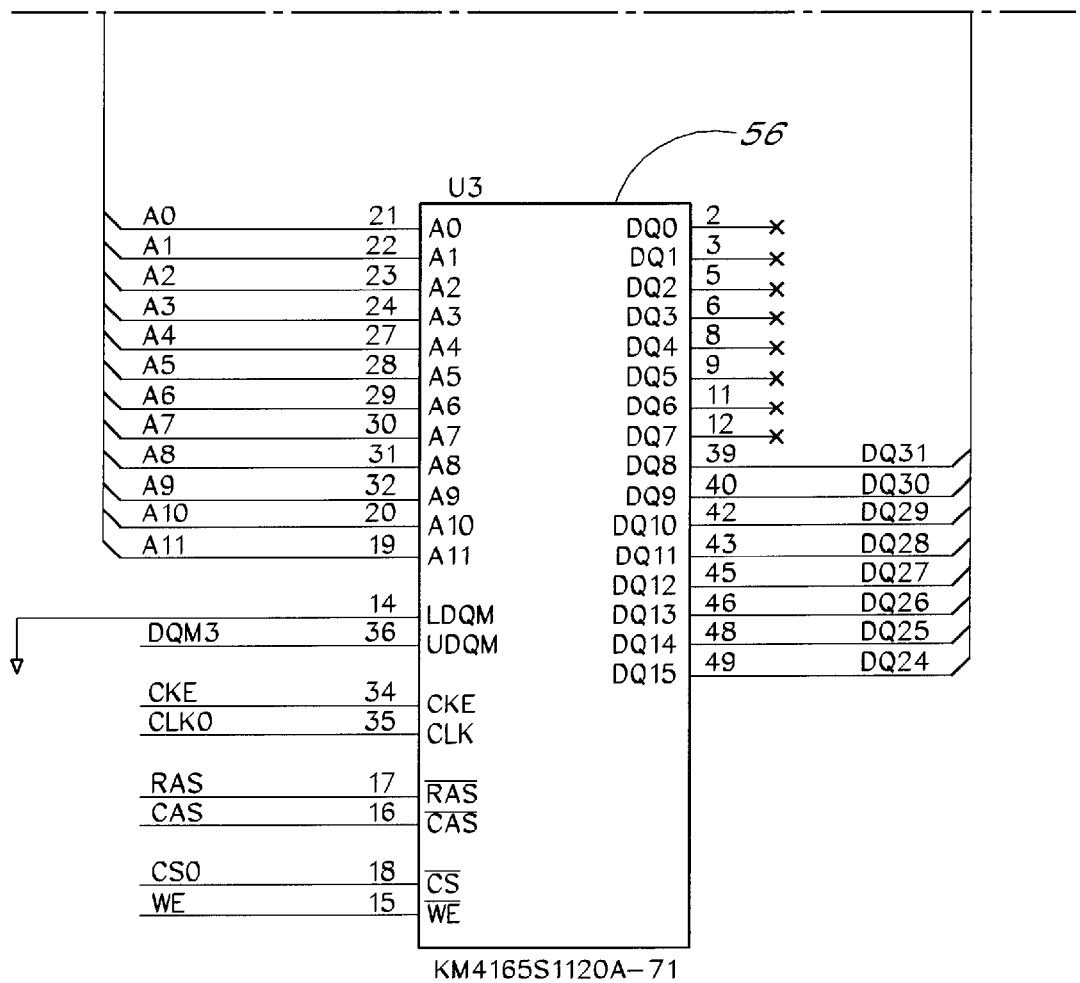
Figure 5F:
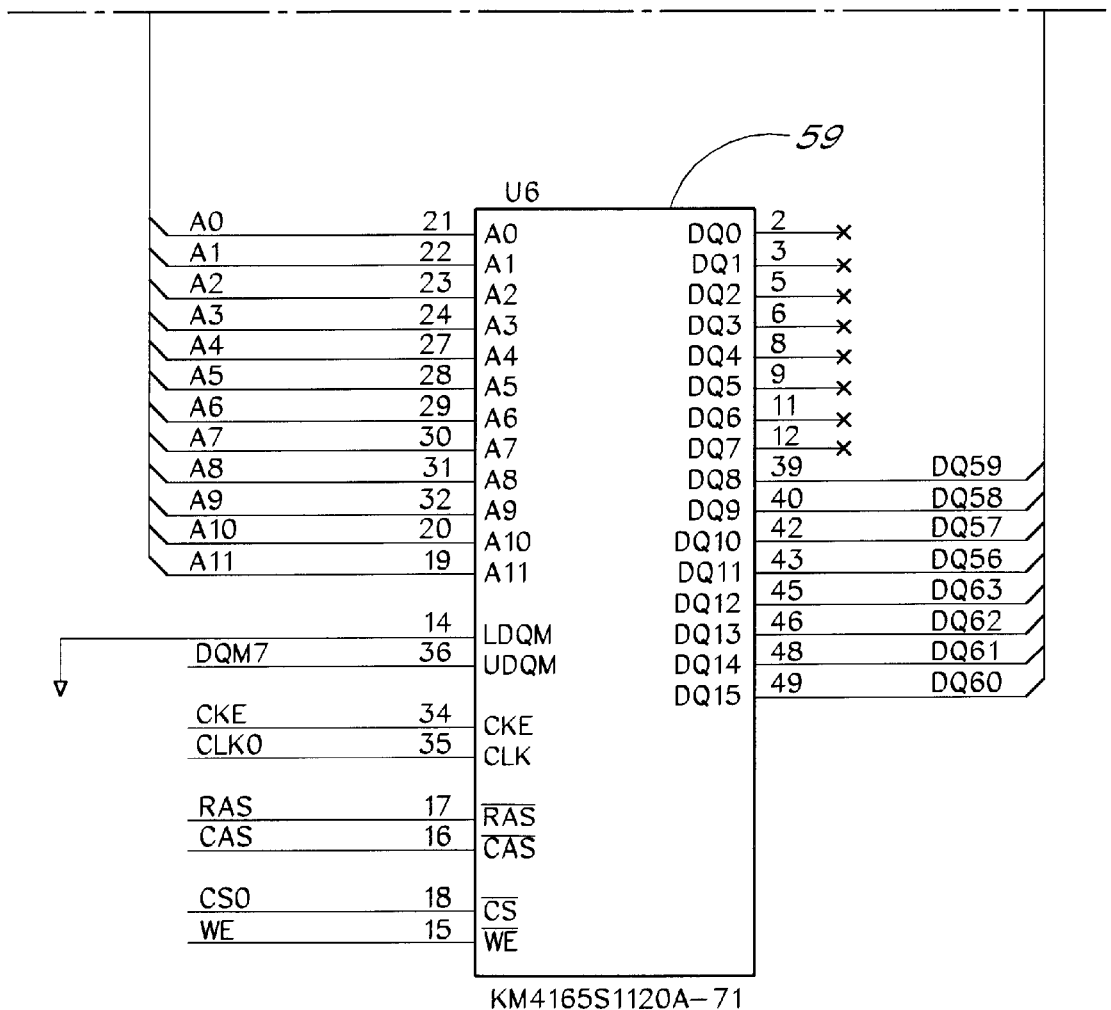
Figure 6A:
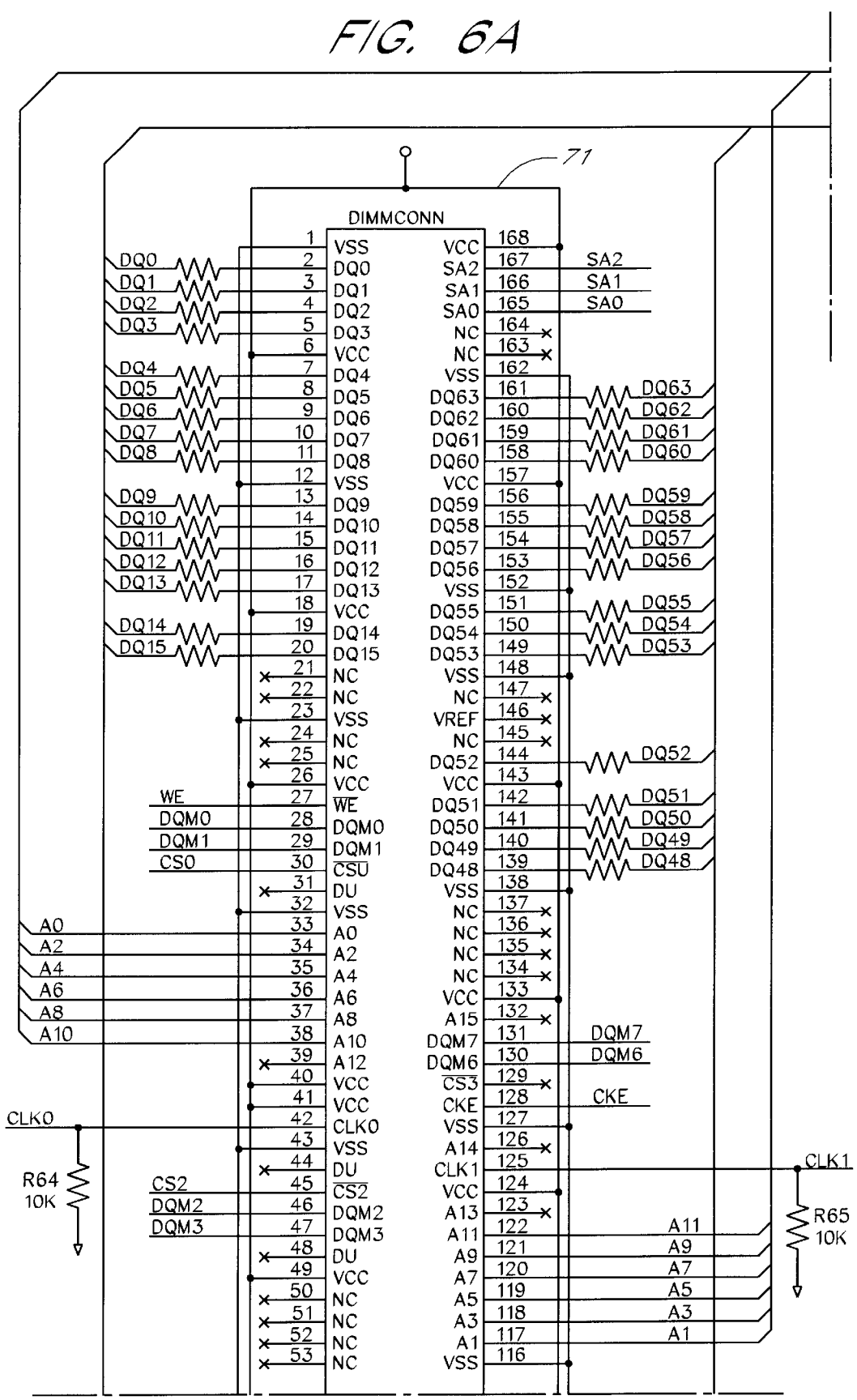
FIGS. 6 and 7 are embodiments of the present invention using sixteen defective SDRAM components where four bits in each of the eight bit memory cells are defective.
Figure 6B:
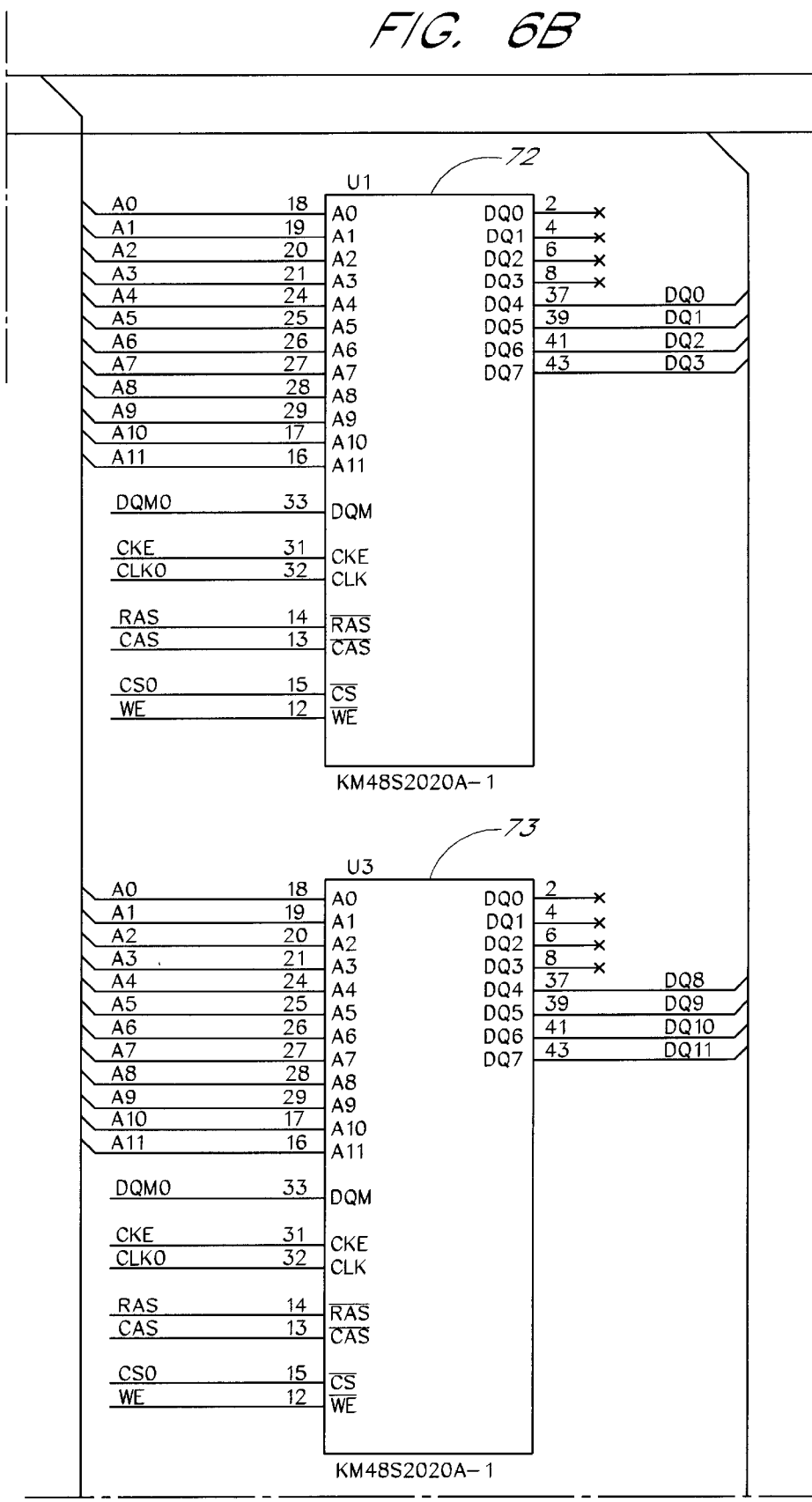
Figure 6C:
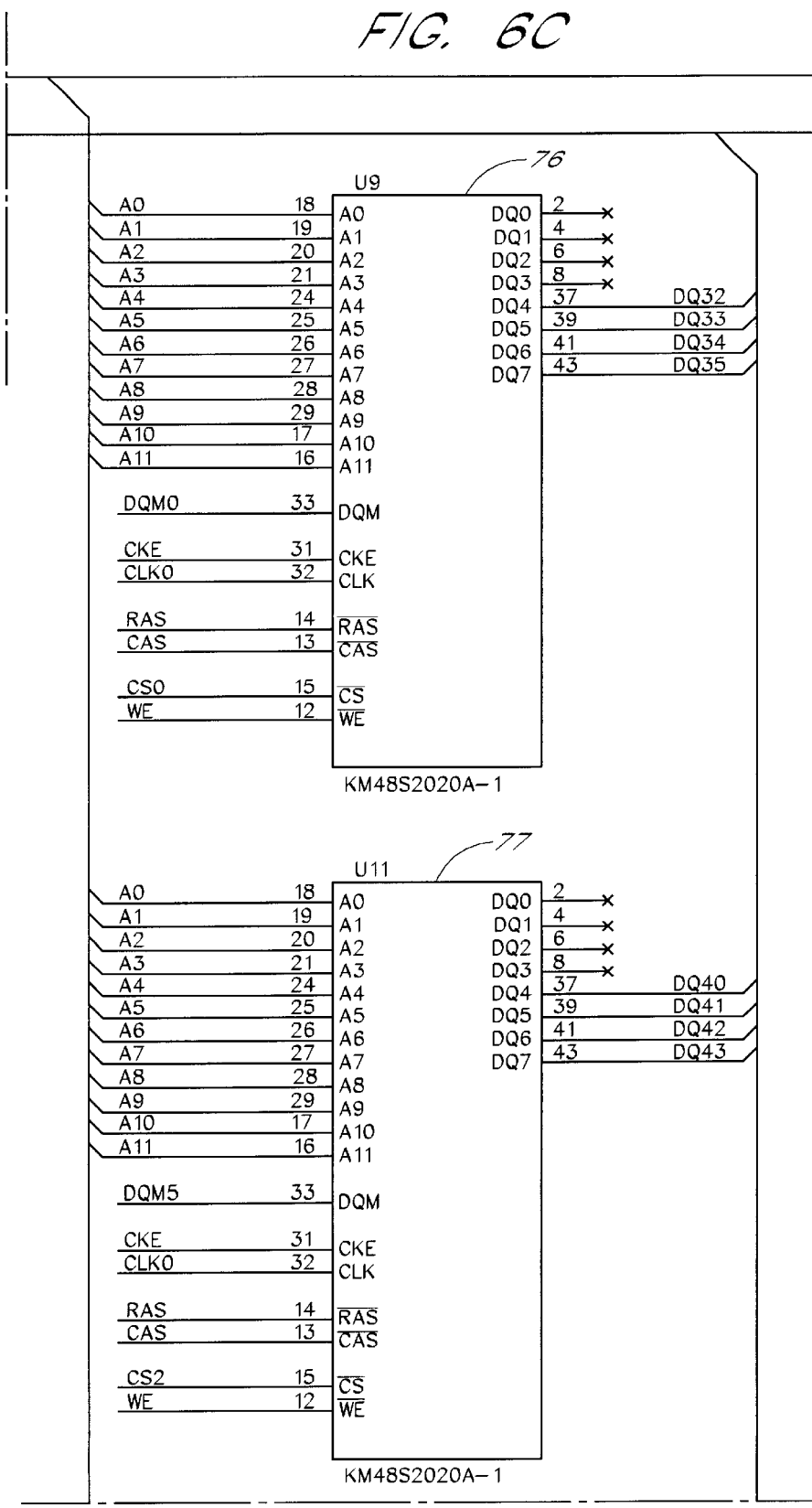
Figure 6D:
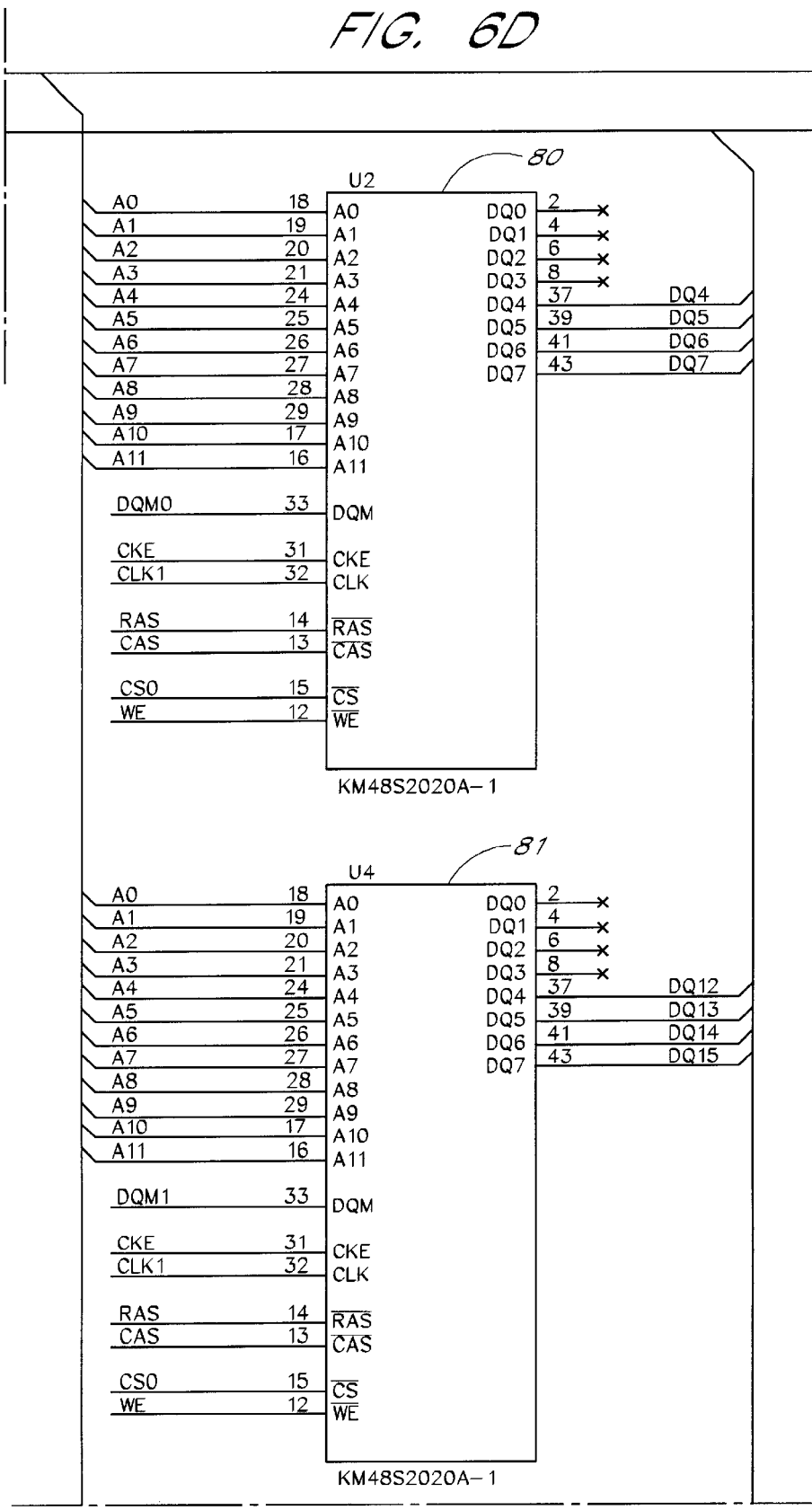
Figure 6E:
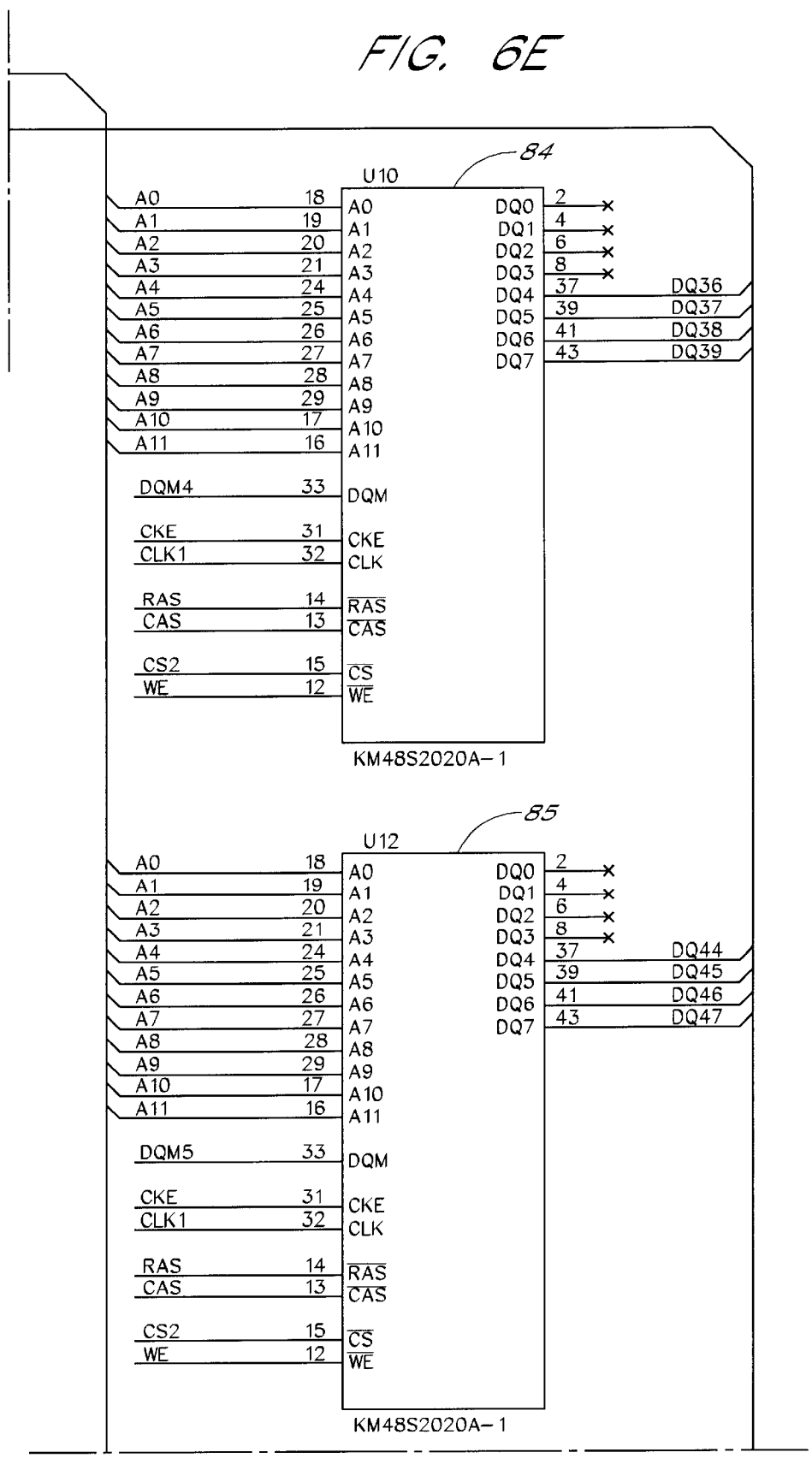
Figure 6F:
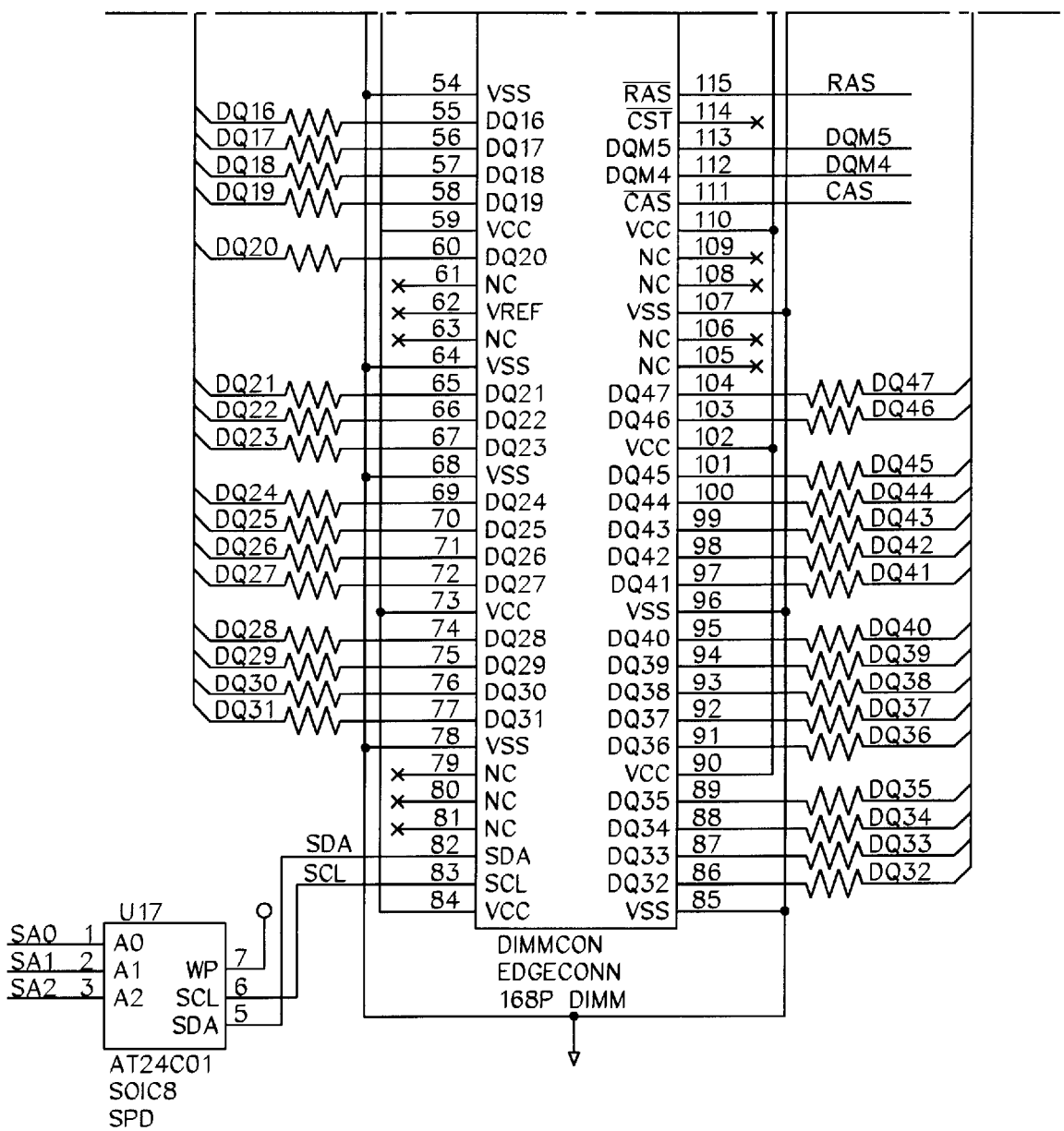
Figure 6G:
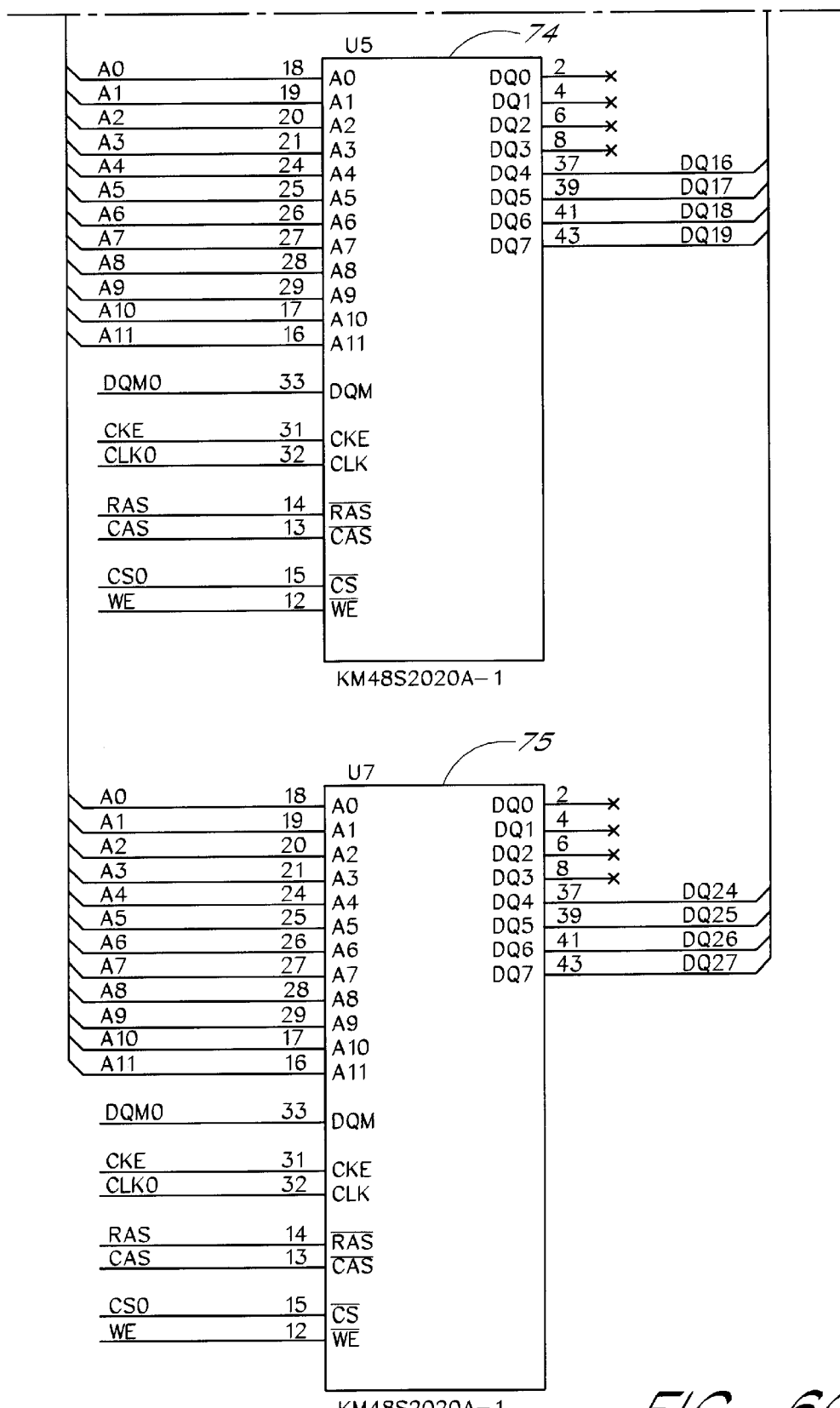
Figure 6J:
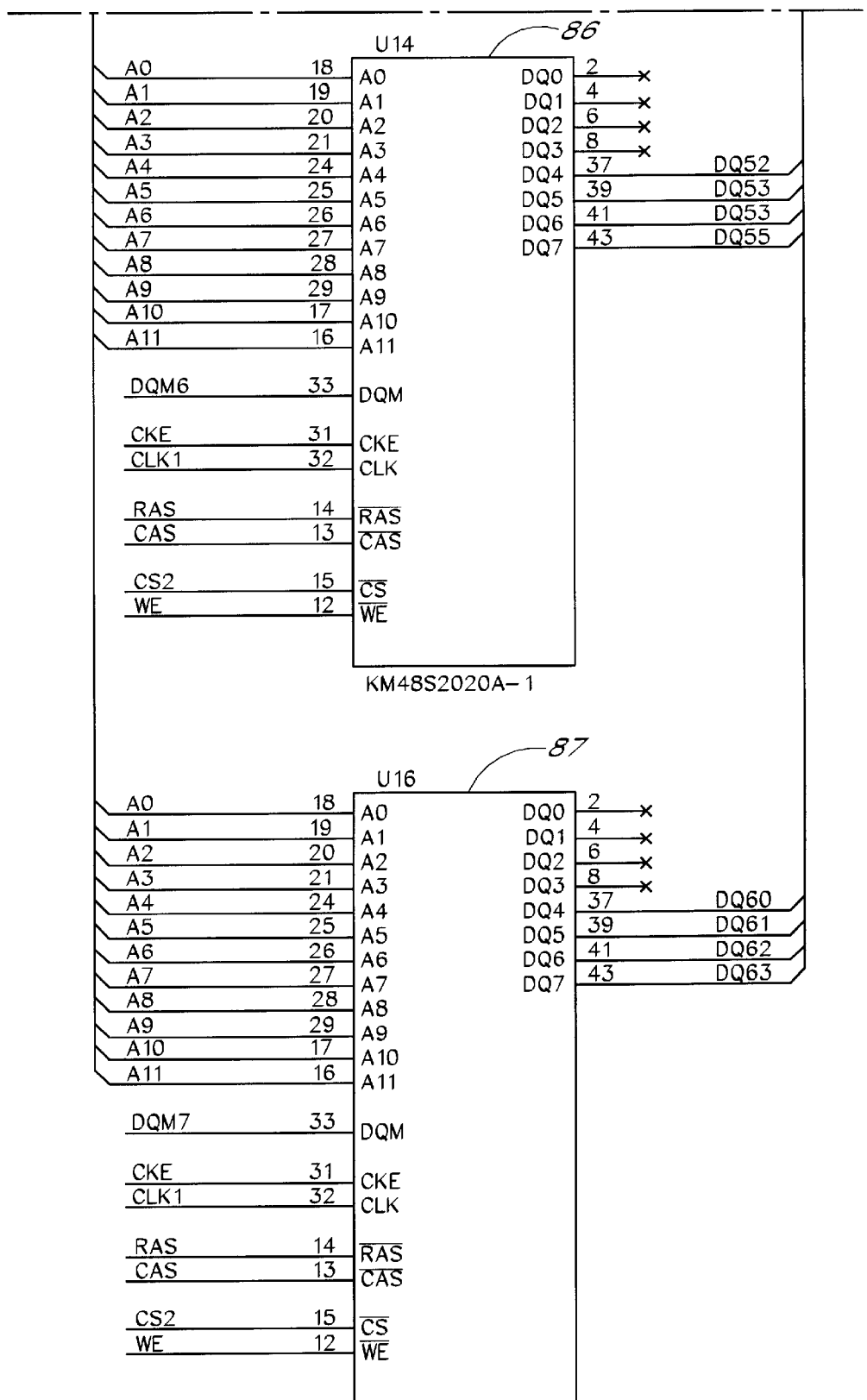
Figure 7A:
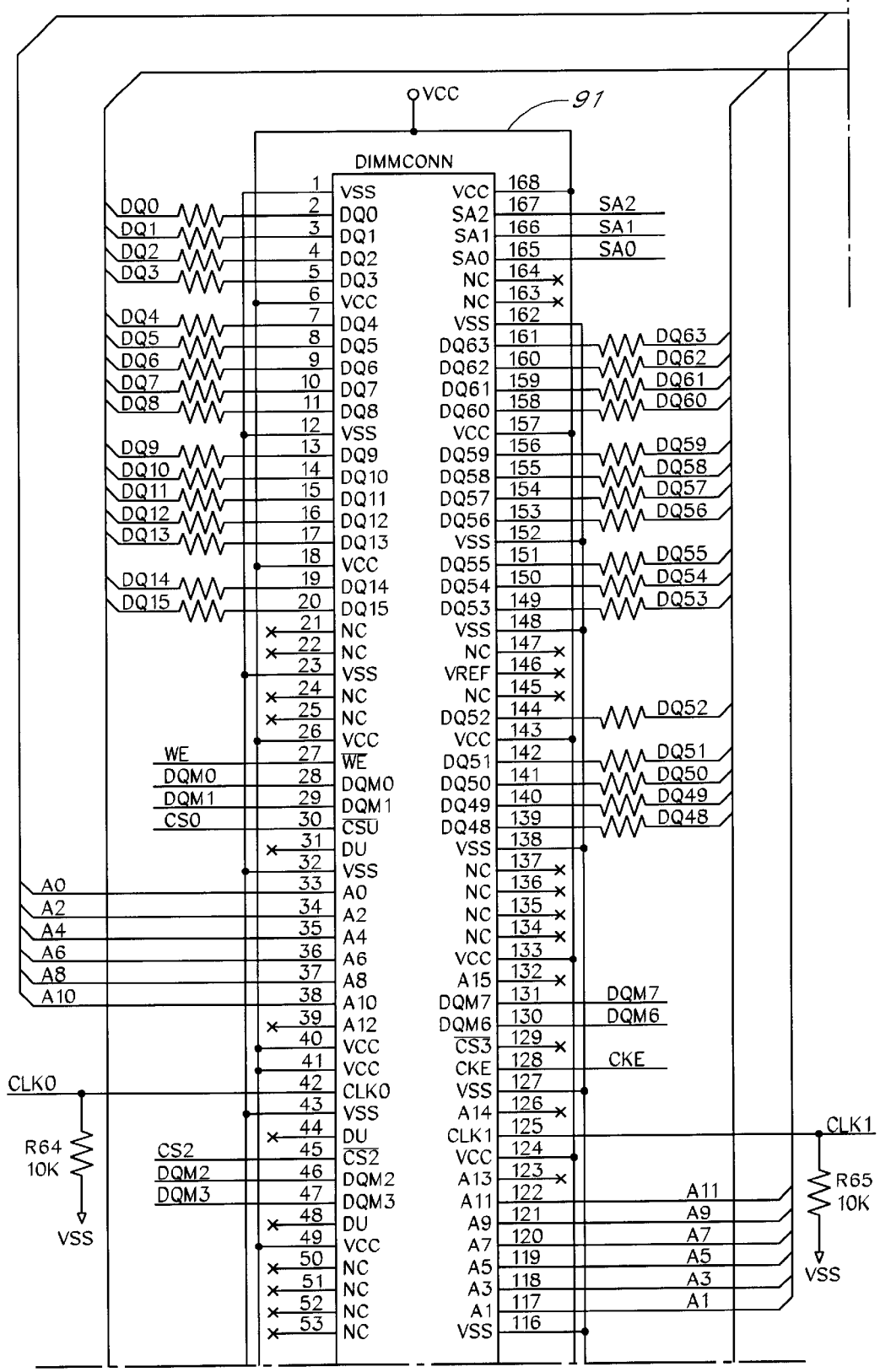
Figure 7B:
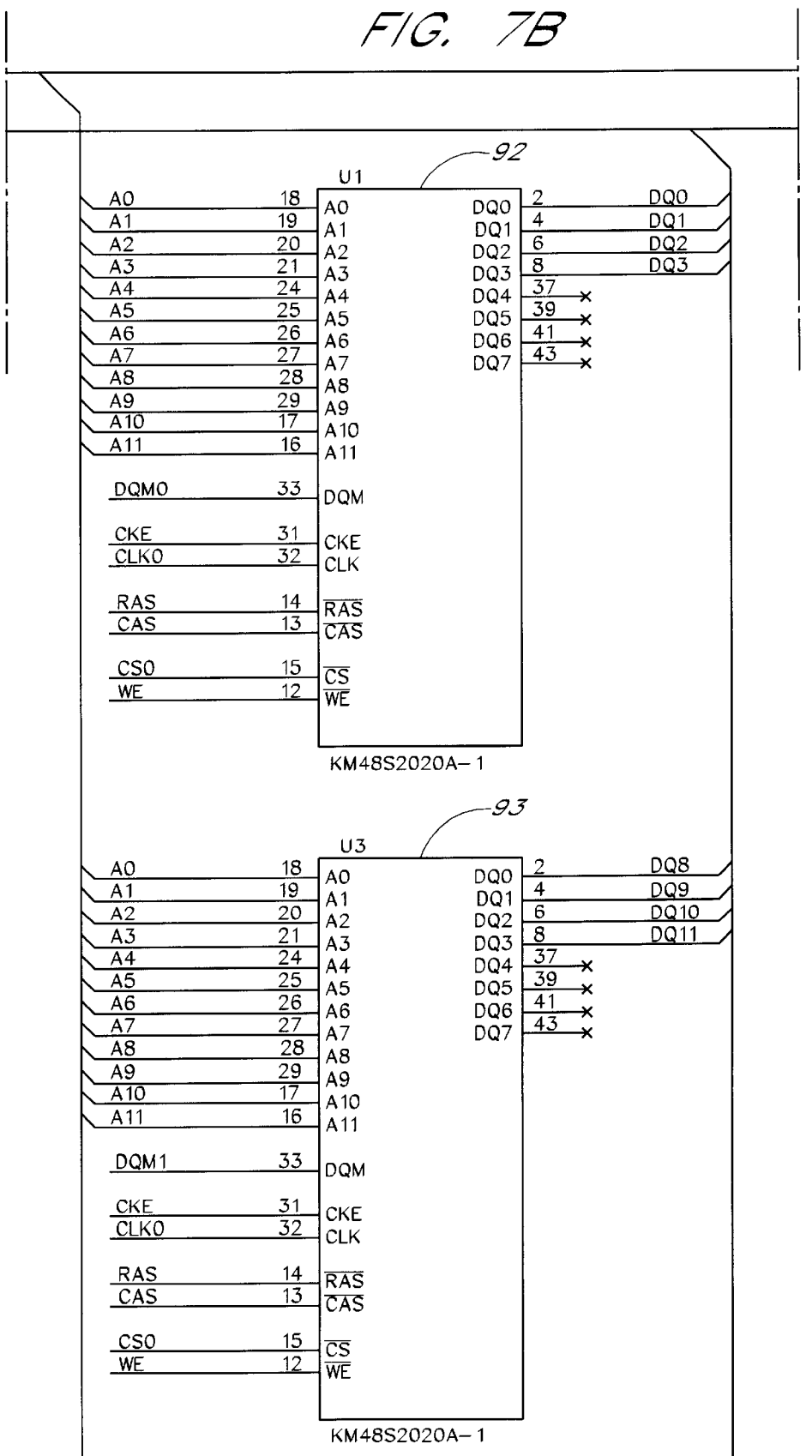
Figure 7C:
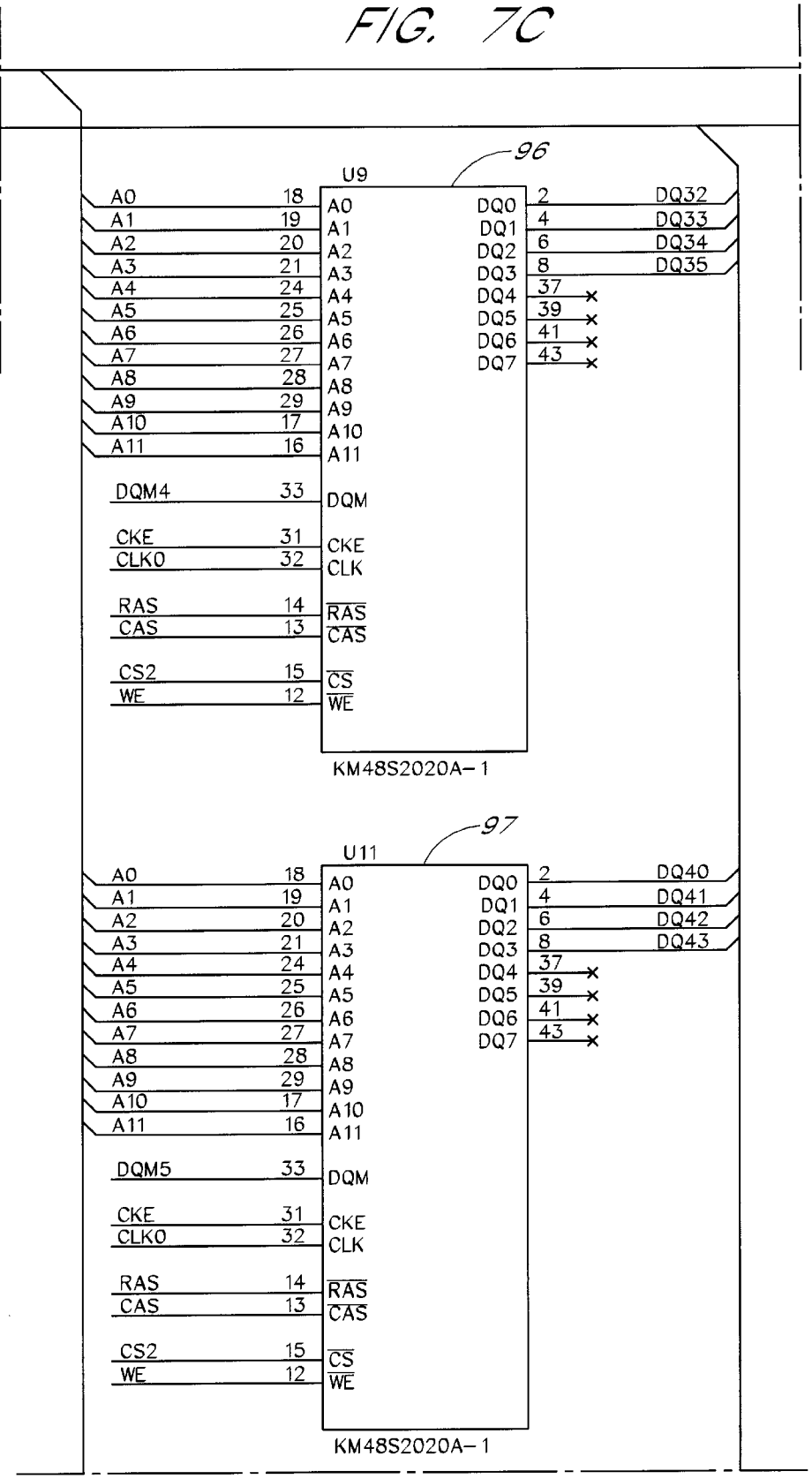
Figure 7D:
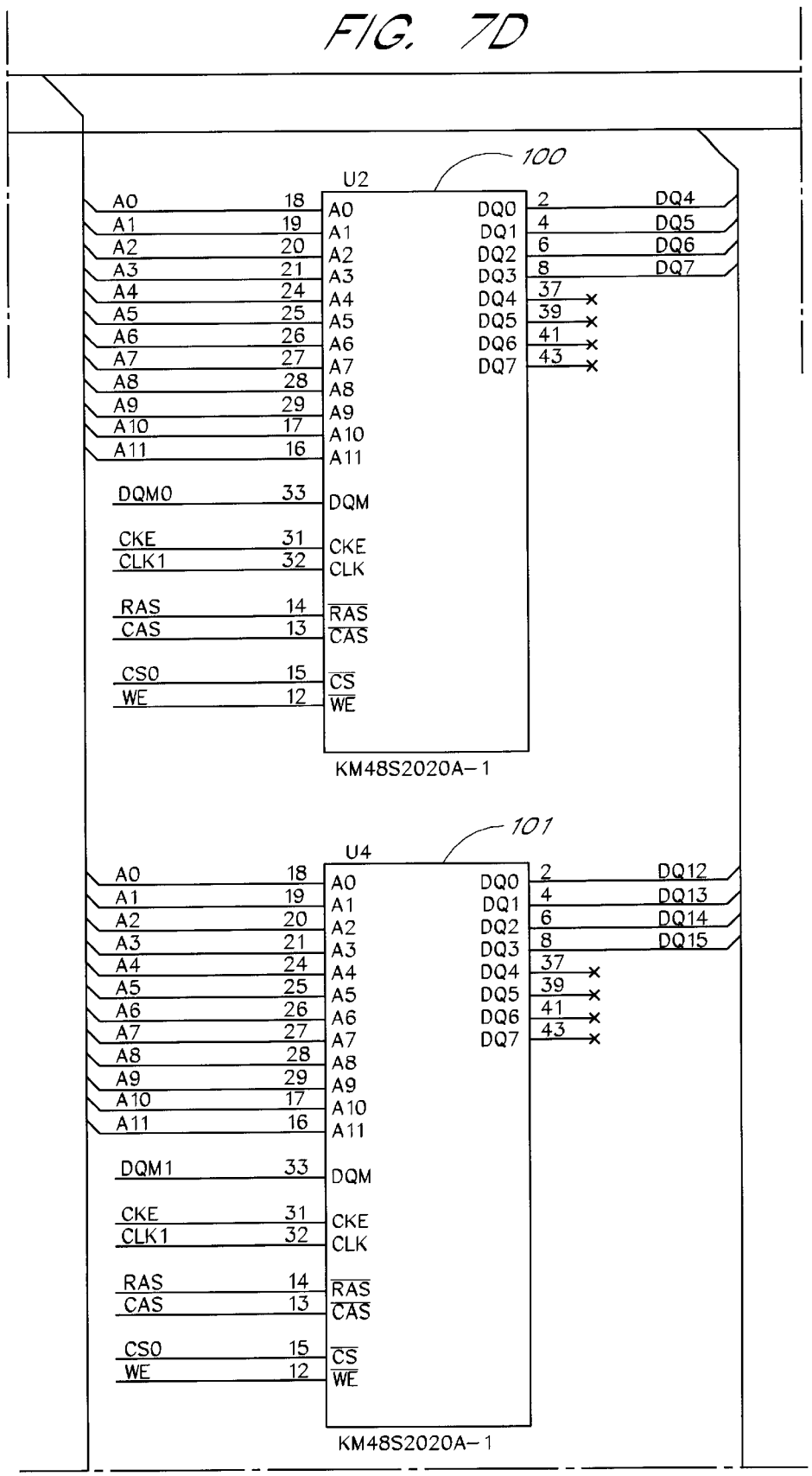
Figure 7E:
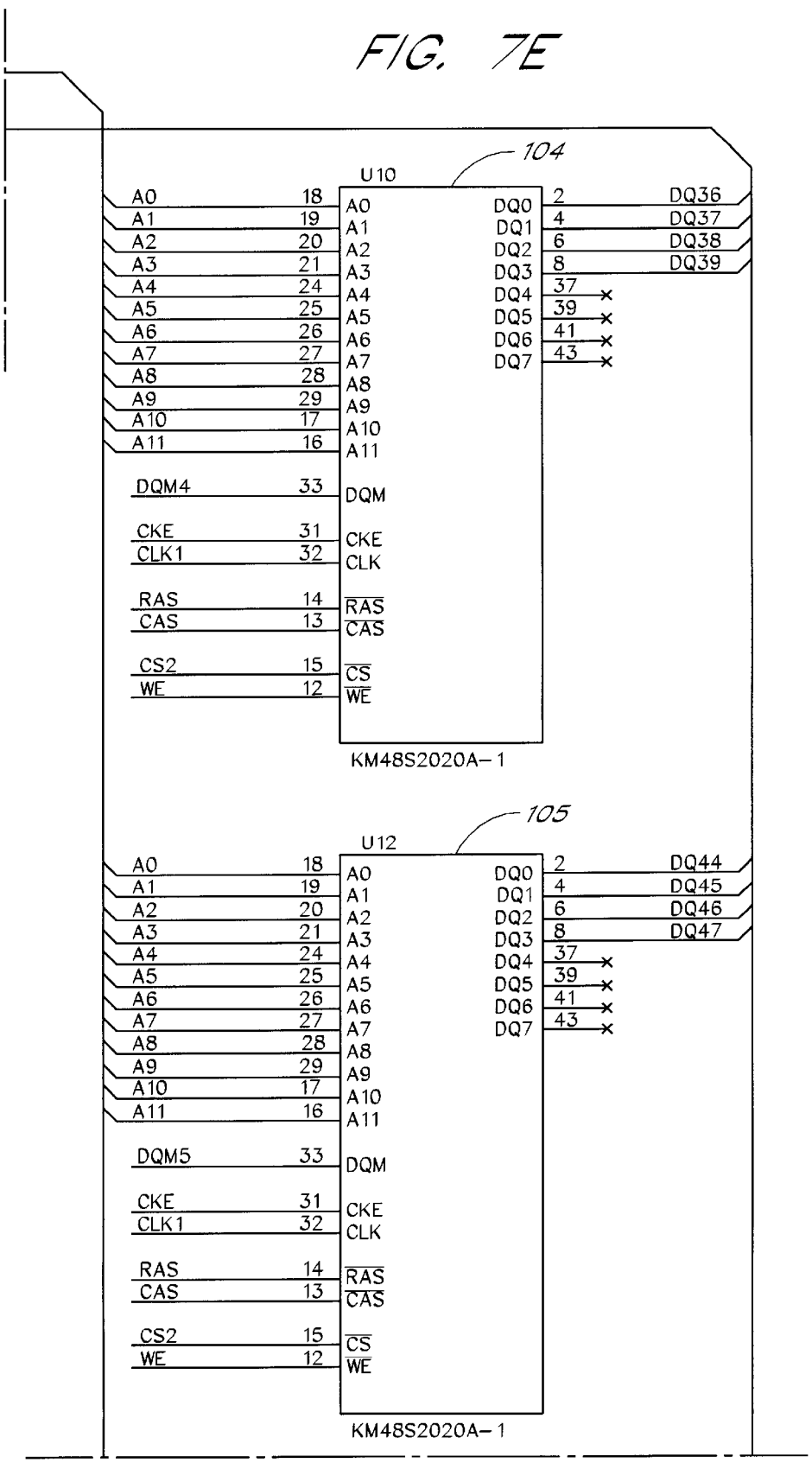
Figure 7F:
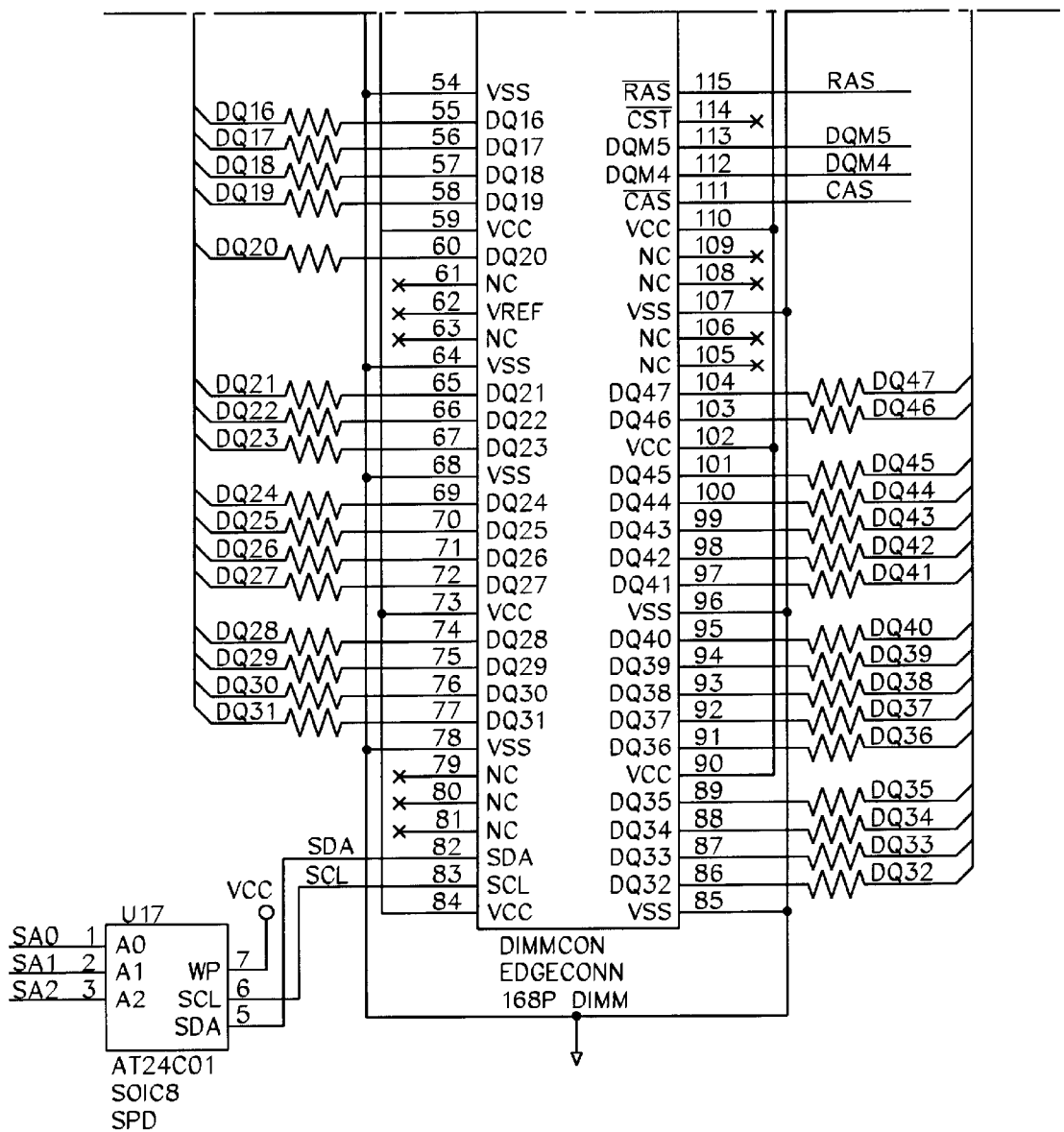
Figure 7H:
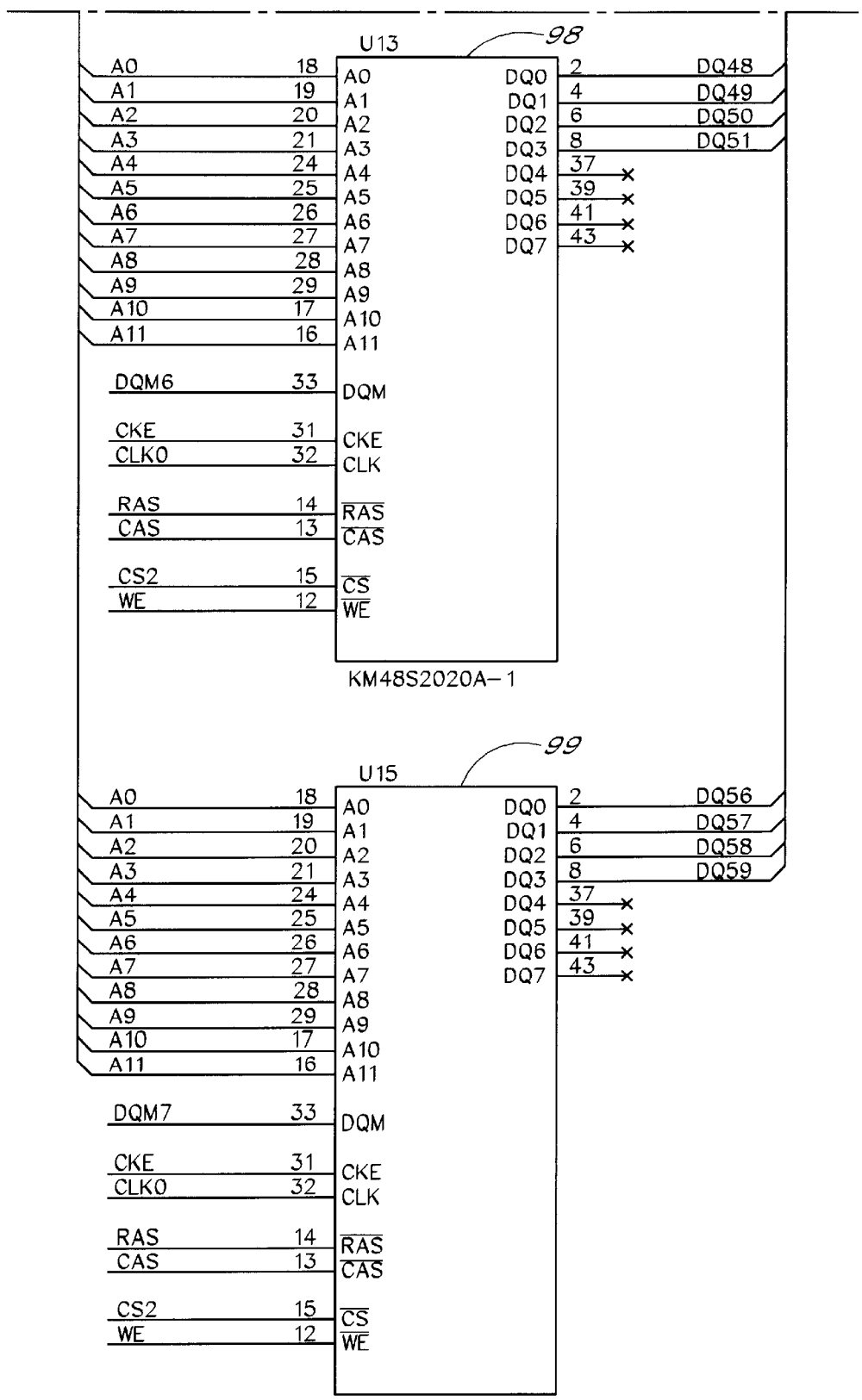
Figure 7J:
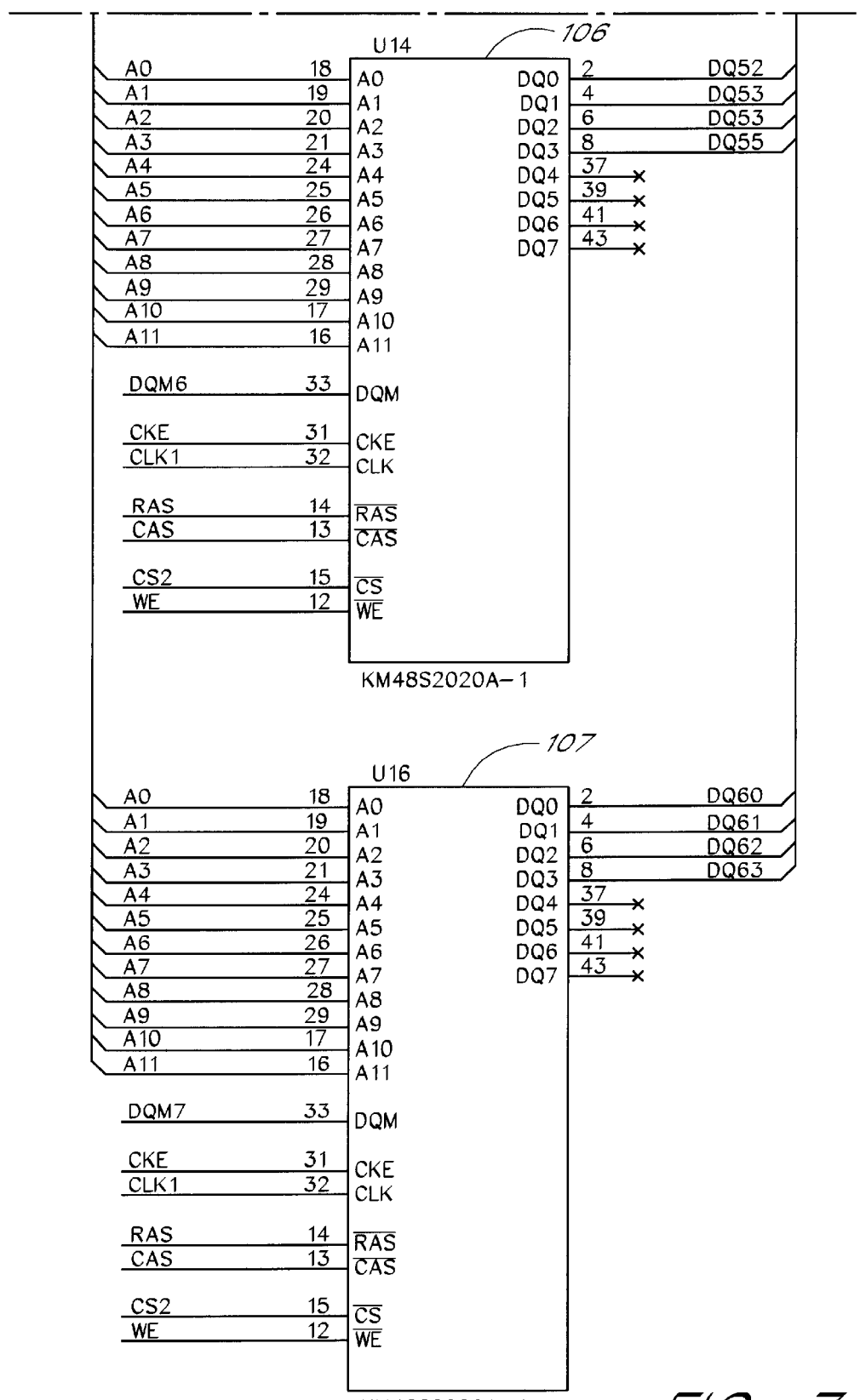

FIG. 5 is a schematic diagram of a memory module in one embodiment of the present invention where multiple partially defective SDRAM components are combined to create a nondefective 512K×64×2 memory module. The edge connector 52 is connected to each of the partially defective 512k×16×2 SDRAM components 54 to 59. Each of the SDRAM components are defective in a manner similar to that shown in FIG. 4. The SDRAM components 54, 55, 57, and 58 each have four defective or unused DQ outputs (i.e., DQ0 to DQ3), and the remaining twelve DQ outputs are not defective. The SDRAM components 56 and 59 have eight unreliable or unused DQ outputs (DQ0 to DQ7), and eight reliable and nondefective DQ outputs. By using the twelve nondefective DQ outputs from SDRAM components 54, 55, 57, and 58 and by using the eight nondefective DQ outputs from SDRAM components 56 and 59, a 512K×64×2 memory module can be constructed from the six partially defective SDRAM components as shown in FIG. 5.

In a manner similar to that described in connection with FIG. 3, the SDRAM components in FIG. 5 are addressed by first presenting an eleven bit row address followed by an eight bit column address. Thus, the memory address is nineteen bits wide. An additional bit is presented at address input A11 with the eleven bit row address to select one of the two 512K memory banks within each SDRAM component.

FIG. 6 is a schematic of another embodiment of the present invention, where sixteen partially defective 1024K× 8×2 SDRAM components 72 to 87 are used to create a 1024K×64×2 memory module. Each of the partially defective SDRAM components in FIG. 6 has four unreliable or unused outputs (DQ0 to DQ3) and four nondefective outputs (DQ4 to DQ7). Using the four nondefective outputs from each of the sixteen SDRAM components provides a 64 bit quad word data path.

The SDRAM components of FIG. 6 are addressed by first presenting an eleven bit row address followed by a nine bit column address. Thus, the memory address is twenty bits wide. An additional bit is presented at address input A11 with the eleven-bit row address to select one of the two 1024K memory banks within each SDRAM component.

It should be understood that the present invention does not necessarily require any particular arrangement for the defective DQ outputs. For example, in FIG. 6, the defective DQ outputs need not be the same for each component 72–87, and the defective outputs may not be consecutive or symmetric. As can be seen from FIG. 6, the components 72 and 80 make up the low order byte of data in the 64-bit quad word. It is possible that component 72 may have only three defective outputs, thereby allowing five bits in the low order byte to be taken from component 72, and only three bits from component 80. Any other combination would also be appropriate. Similarly, the defective outputs in component 80 could come in any combination, and need not be DQ0, DQ1, DQ2, DQ3. Rather, the defective outputs could be DQ1, DQ4, DQ6, and DQ7, or any other combination.

FIG. 7 is a schematic of another embodiment of the present invention, where sixteen partially defective 1M×8×2 SDRAM components 92 to 107 are used to create a 1M×64×2 memory module. Each of the partially defective SDRAM components in FIG. 7 have four unreliable or unused outputs and four nondefective outputs. This embodiment differs from that in FIG. 6 in that the outputs DQ0 to DQ3 are nondefective, whereas outputs DQ4 to DQ7 are defective. The four nondefective outputs from each of the sixteen SDRAM components provides a 64 bit quad word data path.

Although the SDRAM components in FIG. 7 are 1M×8×2 components having two banks of 1M×8 bit memory, it is possible that they could be 2M×8 bit components having only a single bank of memory. In such an embodiment, the components are addressed by first presenting a twelve bit row address to the address inputs A0 to A11, followed by a nine bit column address, which is presented at address inputs A0 to A8. Thus, the full address is 21 bits wide, thereby providing a 2M address space, and the SDRAM components have (or are treated as having) only a single bank of memory.

It is also possible that the memory components have more than two banks of memory. In some more modem devices, two bank select lines (e.g., BA0 and BA1) are used to select one of four banks of memory in a particular component or module. (Often, but not necessarily, such select signals are presented to the component with the row address.) As one skilled in the art would recognize, the present invention is applicable to memory components of this nature, and is applicable generally to memory components having any number of banks of memory.

Although the present invention has been shown and described with respect to preferred embodiments, various changes and modifications that are obvious to a person skilled in the art to which the invention pertains, even if not shown or specifically described herein, are deemed to lie within the spirit and scope of the invention and the following claims.

What is claimed is:

1. A method of accessing a memory module comprising the acts of:

presenting a row address to the address inputs of each of a plurality of partially defective SDRAM components that have at least one unreliable data output, and that also have a plurality of valid data outputs, wherein the valid data outputs are data outputs that provide reliable and accurate data; and presenting a column address to the address inputs of each SDRAM component;

aggregating the valid data outputs of each of the SDRAM components to provide a data path; and communicating the data from the valid data outputs to a microprocessor.

2. The method of claim 1, wherein the act of presenting a row address includes the act of presenting a row address to the address inputs of partially defective SDRAM components, where for each of these SDRAM components, the plurality of valid data outputs are the same for each addressable memory location within that component so that the same portion of each addressable memory location within any given SDRAM component consistently provides valid and accurate data.

3. The method of claim 2, wherein the act of presenting a row address to the address inputs of each of a plurality of partially defective SDRAM components includes the act of presenting a row address to SDRAM components mounted on SIMMs.

4. The method of claim 3, wherein the act of presenting a row address to the address inputs of each of a plurality of partially defective SDRAM components includes the act of presenting a row address to SDRAM components mounted on DIMMs.

5. A method of accessing memory cells in a memory module having a plurality of SDRAM components, each of the SDRAM components having a plurality of address inputs, and wherein each of the SDRAM components further comprises a plurality of banks of memory that are addressable by the address inputs, the method comprising the acts of:

presenting a row address to the address inputs of each SDRAM component;

presenting a column address to the address inputs of each SDRAM component;

selecting one of the plurality of banks within each SDRAM component by presenting at least one selection bit at the address inputs when the row address is presented to the address inputs, wherein each of the SDRAM components is partially defective such that each SDRAM components has at least one unreliable data output, and also a plurality of valid data outputs that provide reliable and accurate data;

aggregating the valid data outputs of each of the SDRAM components to provide a data path; and communicating the data from the valid data outputs from each of the SDRAM components to a microprocessor.

6. The method of claim 5, wherein the act of presenting a row address includes the act of presenting a row address to the address inputs of partially defective SDRAM components, where for each of these SDRAM components, the plurality of valid data outputs are the same for each addressable memory location within that component so that the same portion of each addressable memory location within any given SDRAM component consistently provides valid and accurate data.

7. The method of claim 6, wherein the act of presenting a row address to the address inputs of each of a plurality of partially defective SDRAM components includes the act of presenting a row address to SDRAM components mounted on SIMMs.

8. The method of claim 7, wherein the act of presenting a row address to the address inputs of each of a plurality of partially defective SDRAM components includes the act of presenting a row address to SDRAM components mounted on DIMMs.

9. A method of enabling data access between a memory module having data outputs and a microprocessor comprising the acts of:

determining which SDRAM data outputs of a group of SDRAM components are defective;

assembling a set of SDRAM components from the group of SDRAM components, wherein at least one of the SDRAM components has defective SDRAM data outputs, such that each memory module data output is connected to an operative SDRAM data output; and applying a clock signal that is processed to synchronously apply operating signals to the memory module and the microprocessor to effect data access between the memory module and the microprocessor.

10. The method of claim 9 firther comprising sorting SDRAM components based on which of the data outputs of the respective SDRAM components are defective.

11. The method of claim 10 further comprising providing sorted SDRAM components with predetermined numbers and arrangements of defective SDRAM data outputs for assemble on predetermined, complementary memory modules.

12. The method of claim 9 wherein determining which data outputs are defective includes testing SDRAM components prior to assembling the SDRAM components on a memory module.

* * * * *